(12) United States Patent
Etgar et al.

(10) Patent No.: US 10,192,689 B2
(45) Date of Patent: Jan. 29, 2019

(54) SELF-ASSEMBLY OF PEROVSKITE FOR FABRICATION OF TRANSPARENT DEVICES

(71) Applicant: Yissum Research Development Company of the Hebrew University of Jerusalem Ltd, Jerusalem (IL)

(72) Inventors: Lioz Etgar, Jerusalem (IL); Shlomo Magdassi, Jerusalem (IL); Sigalit Aharon, Jerusalem (IL); Michael Layani, Jerusalem (IL)

(73) Assignee: YISSUM RESEARCH DEVELOPMENT COMPANY OF THE HEBREW UNIVERSITY OF JERUSALEM LTD., Jerusalem (IL)

( * ) Notice: Subject to any disclaimer, the term of this patent is extended or adjusted under 35 U.S.C. 154(b) by 0 days.

(21) Appl. No.: 15/541,726

(22) PCT Filed: Jan. 7, 2016

(86) PCT No.: PCT/IL2016/050019
§ 371 (c)(1),
(2) Date: Jul. 6, 2017

(87) PCT Pub. No.: WO2016/110851
PCT Pub. Date: Jul. 14, 2016

(65) Prior Publication Data
US 2018/0277309 A1    Sep. 27, 2018

Related U.S. Application Data

(60) Provisional application No. 62/100,667, filed on Jan. 7, 2015, provisional application No. 62/110,703, filed on Feb. 2, 2015.

(51) Int. Cl.
*H01G 9/20* (2006.01)
*H01L 51/42* (2006.01)
*H01L 51/00* (2006.01)

(52) U.S. Cl.
CPC ......... *H01G 9/2045* (2013.01); *H01G 9/2009* (2013.01); *H01L 51/0077* (2013.01); *H01L 51/4213* (2013.01); *H01L 51/4226* (2013.01)

(58) Field of Classification Search
None
See application file for complete search history.

(56) References Cited

U.S. PATENT DOCUMENTS

2004/0129922 A1   7/2004   Shibuya et al.
2005/0036939 A1   2/2005   Wong et al.
(Continued)

FOREIGN PATENT DOCUMENTS

CN    101992089 A    3/2011
CN    102241967 A    11/2011
(Continued)

OTHER PUBLICATIONS

Schmidt, Luciana C., et al. "Nontemplate Synthesis of CH3NH3PbBr3 Perovskite Nanoparticles." Journal of the American Chemical Society, vol. 136, No. 3, 2014, pp. 850-853., doi:10.1021/ja4109209.*
(Continued)

*Primary Examiner* — Joseph Schoenholtz
(74) *Attorney, Agent, or Firm* — Vorys, Sater, Seymour and Pease LLP

(57) ABSTRACT

Provided is a continuous material pattern, the pattern is selected to have a plurality of material-free voids, the material including at least one perovskite material.

19 Claims, 14 Drawing Sheets

(56) References Cited

U.S. PATENT DOCUMENTS

| | | | |
|---|---|---|---|
| 2008/0283122 A1 | 11/2008 | Campbell et al. | |
| 2009/0022971 A1 | 1/2009 | Cole | |
| 2011/0214728 A1 | 9/2011 | Veerasamy | |
| 2012/0017976 A1 | 1/2012 | Nechache et al. | |
| 2012/0103660 A1* | 5/2012 | Gupta | H01L 51/0021 174/126.2 |
| 2012/0132272 A1 | 5/2012 | Steirer et al. | |
| 2013/0233377 A1 | 9/2013 | Kanatzidis et al. | |
| 2015/0064628 A1* | 3/2015 | Guo | G03F 7/30 430/316 |
| 2017/0186559 A1* | 6/2017 | Zhu | H01L 51/4226 |

FOREIGN PATENT DOCUMENTS

| | | |
|---|---|---|
| EP | 2 693 503 A1 | 2/2014 |
| WO | 2013/171520 A1 | 11/2013 |
| WO | 2014/020499 A1 | 2/2014 |
| WO | 2014/097299 A1 | 6/2014 |
| WO | 2015/177770 A2 | 11/2015 |

OTHER PUBLICATIONS

Zhang, Dandan, et al. "Solution-Phase Synthesis of Cesium Lead Halide Perovskite Nanowires." Journal of the American Chemical Society, vol. 137, No. 29, 2015, pp. 9230-9233., doi:10.1021/jacs.5b05404.*

Zuo, Lijian, et al. "Enhanced Photovoltaic Performance of CH3NH3PbI3 Perovskite Solar Cells through Interfacial Engineering Using Self-Assembling Monolayer." Journal of the American Chemical Society, vol. 137, No. 7, 2015, pp. 2674-2679., doi:10.1021/ja512518r.*

Chen., "Schottky solar cells based on CsSnI3 thin-films", Applied Physics Letters, vol. 101, 093901-1-093901-4, (2012).

Cohen et al., "Impact of Anti-Solvent Treatment on Carrier Density in Efficient Hole Conductor Free Perovskite based Solar Cells", The Journal of Physical Chemistry, fourteen pages, (2015).

Eperon et al., "Neutral Color Semitransparent Microstructured Perovskite Solar Cells", ACS Nano, vol. 8, No. 1, pp. 591-598, (2014).

Etgar et al., "Mesoscopic ch3NH3PbI3/TiO2 Heterojunction Solar Cells", J. Am. Chem. Soc., vol. 134, pp. 17396-17399, (2012).

Etgar et al., "Core/Shell PbSe/PbS QDs TiO2 Heterojunction Solar Cell", Adv. Funct. Mater., vol. 23, pp. 2736-2741,(2013).

Etgar et al., "Enhancing the open circuit voltage of dye sensitized solar cells by surface engineering of silica particles in a gel electrolyte", J. Mater. Chem. A, vol. 1 , pp. 10142-10147, (2013).

Im et al., "6.5% efficient perovskite quantum-dot-sensitized solar cell", Nanoscale, vol. 3, pp. 4088-4093, (2011).

Im et al., "Synthesis, structure, and photovoltaic property of a nanocrystalline 2H perovskite-type novel sensitizer (CH3CH2NH3)PbI3", Nanoscale Research Letters, vol. 7, 353, seven pages, (2012).

Im et al., "Nanowire Perovskite Solar Cell", Nano Lett., vol. 15, pp. 2120-2126, (2015).

Kagan et al., "Organic-Inorganic Hybrid Materials as Semiconducting Channels in Thin-Film Field-Effect Transistors", Science, vol. 286, pp. 945-947, (1999).

Kim et al., "Lead Iodide Perovskite Sensitized All-Solid-State Submicron Thin Film Mesoscopic Solar Cell with Efficiency Exceeding 9%", Scientific Reports, vol. 2, 591, nine pages, (2012).

Kojima et al., "Organometal Halide Perovskites as Visible-Light Sensitizers for Photovoltaic Cells", J. Am. Chem. Soc., vol. 131, pp. 6050-6051, (2009).

Kojima et al., "Highly Luminescent Lead Bromide Perovskite Nanoparticles Synthesized with Porous Alumina Media", Chem. Lett., vol. 41, pp. 397-399, (2012).

Laban et al., "Depleted hole conductor-free lead halide iodide heterojunction solar cells", Energy Environ. Sci., vol. 6, pp. 3249-3253, (2013).

Lee et al., "Efficient Hybrid Solar Cells Based on Meso-Superstructured Organometal Halide Perovskites", Science, vol. 338, pp. 643-647, (2012).

Liu et al., "Efficient planar heterojunction perovskite solar cells by vapour deposition", Nature, vol. 501, 395, eight pages, (2013).

Mitzi et al., "Transport, Optical, and Magnetic Properties of the Conducting Halide Perovskite CH3NH3SnI3", Journal of Solid State Chemistry, vol. 114, pp. 159-163, (1995).

Ono et al., "Semi-Transparent Perovskite Films with Centimeter-scale Superior Uniformity by the Hybrid Deposition Method", Energy Environ. Sci., vol. 00, 1-3, five pages, (2014).

Roldan-Carmona et al., "High efficiency single-junction semitransparent perovskite solar cells", Energy Environ. Sci., vol. 7, pp. 2968-2973, (2014).

Wong et al., "Growth and Anion Exchange Conversion of CH3NH3PbX3 Nanorod Arrays for Light-Emitting Diodes", Nano Lett., vol. 15, pp. 5519-5524, (2015).

Zheng, "Development of Photoelectric Materials with Organic-inorganic Hybrid Perovskite Structure", Series No. 1; No. 9; B020-12, two pages, (2008).

Zhu et al., "Lead halide perovskite nanowire lasers with low lasing thresholds and high quality factors", Nature Materials, vol. 14, pp. 636-642, (2015).

* cited by examiner

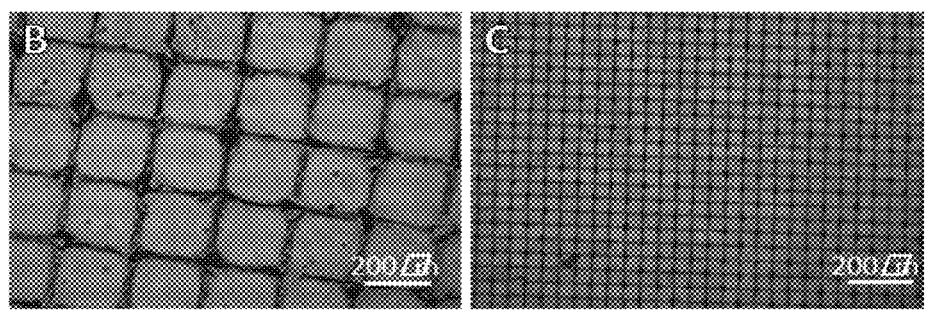
Figure 1D-E
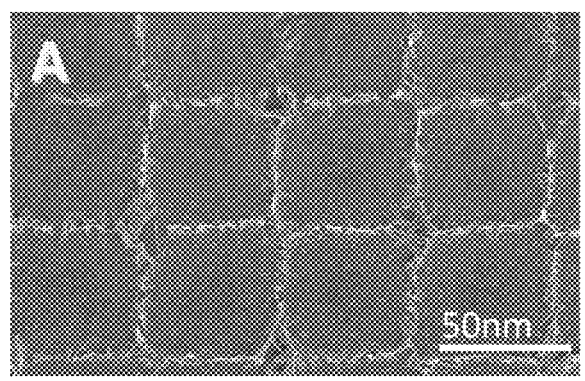
Figure 2A
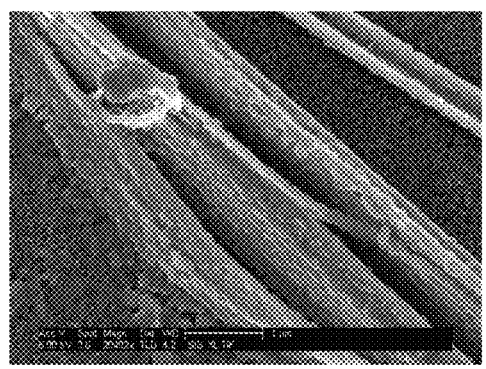
Figure 2B

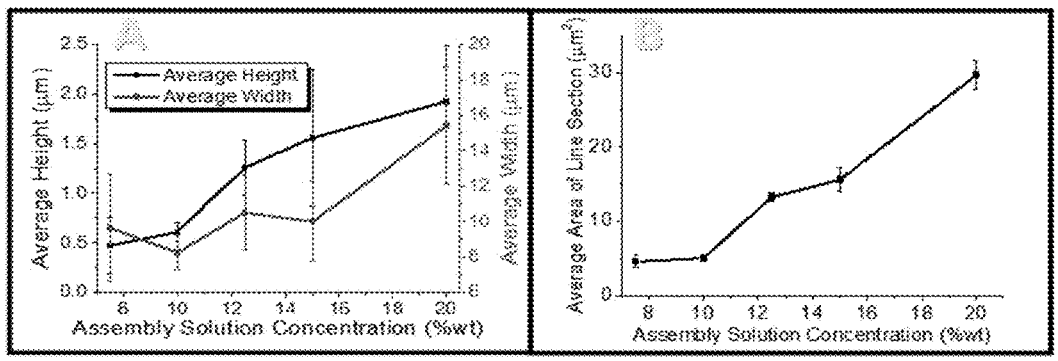
Figure 3A-B
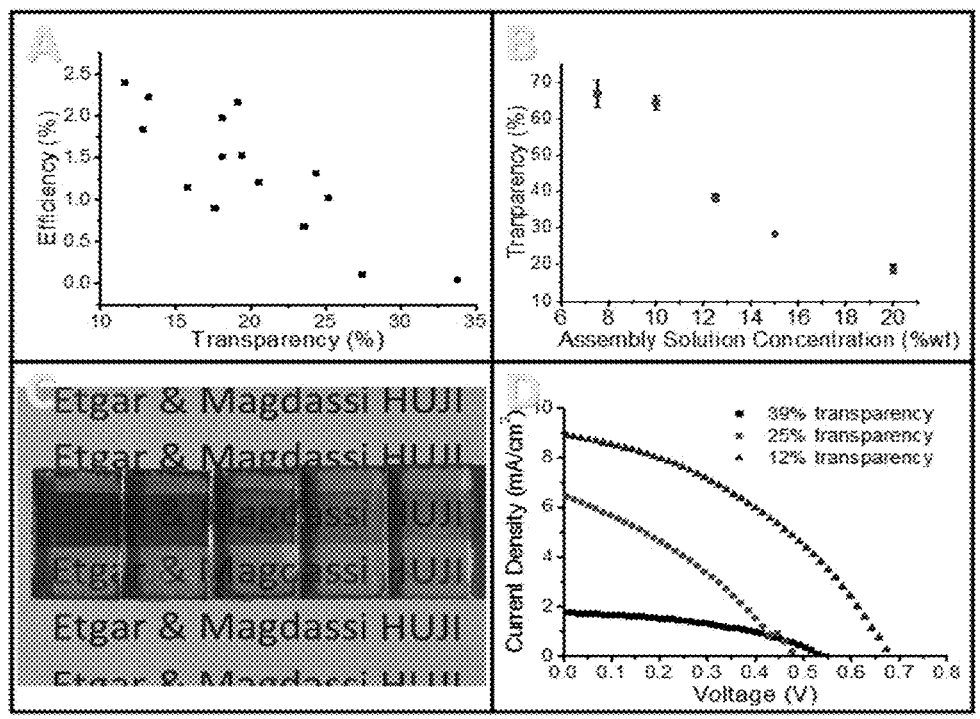
Figure 4A-D

SELF-ASSEMBLY OF PEROVSKITE FOR FABRICATION OF TRANSPARENT DEVICES

TECHNOLOGICAL FIELD

The invention disclosed herein generally relates to the construction of novel semi-transparent or transparent perovskite-based electronic or optoelectronic devices (e.g., solar cells) and novel hybrid meso-planar perovskite-based electronic or optoelectronic devices.

BACKGROUND

An attractive application of semi-transparent photovoltaic (PV) solar cells is the possibility to use them in building integrated elements that can lead to self-sustaining buildings at low cost. Organic and inorganic materials have been widely used for the development of semi-transparent solar cells and have been suggested for integration in office buildings and replacement windows. This integration offers harvesting of solar energy over wider surfaces.

Thus far, there are only a few reports about the development of semi-transparent perovskite solar cells. Eperon et al [1] used a strategy which relied on de-wetting of a perovskite film to create 'perovskite islands'; thus achieving high transmittance while decreasing the overall PCE due to the voids within the active layer. Moreover, it seems that with this method it is difficult to precisely control the transparency of the cell.

In other reports [2,3], a thin perovskite layer was deposited by evaporation. However, evaporation-based processes are very costly, require high capital investments, and are very complicated for up-scaling, which is required for industrial applications. In addition, the evaporation technique, using only a thin film of the absorber material in the solar cell (i.e. the perovskite) leads to a decrease of the overall solar cell efficiency.

REFERENCE

[1] G. E. Eperon, V. M. Burlakov, A. Goriely and H. J. Snaith, "Neutral color Semitransparent Microstructured Provskite Solar Cells", ACS Nano, 2014, 8 (1), 591-598.
[2] L. K. Ono, S. Wang, Y. Kato, S. R. Rega and Y. Qi, "Fabrication of Semi-Transparent Perovskite Films with Centimeter-Scale Superior Uniformity by the Hybrid Deposition Method", Energy Environ. Sci., 2014.
[3] Cristina Roldan, Olga Malinkiewicz, Rafael Betancur, Giulia Longo, Cristina Momblona, Franklin Jaramillo, Luis Camacho and Henk J. Bolink "High efficiency single-junction semitransparent perovskite solar cells", Energy & Environmental Science, 2014.
[4] Bat-El Cohen, Sigalit Aharon, Alexander Dymshits, and Lioz Etgar, "Impact of Anti-Solvent Treatment on Carrier Density in Efficient Hole Conductor Free Perovskite based Solar Cells".

GENERAL DESCRIPTION OF THE INVENTION

The inventors of the present invention have developed a unique wet deposition method for the fabrication of novel transparent or semi-transparent continuous perovskite patterns for construction of novel perovskite-based electronic or optoelectronic devices (e.g., solar cells). This method is based on self-assembly of perovskite precursor solution through wetting along walls of a printing screen (mesh).

The use of this method not only established means to direct the perovskite material to be formed on the walls of the screen, defining precisely a desired pattern and therefore endowing the ability to control certain features of the pattern (e.g., the openings size or the thickness of the perovskite rim or side, leading to control of the pattern transparency and conductivity), but also insured fabrication of continuous patterns having uniform composition throughout the film, and endowing the ability to form large-scale patterns with excellent reliability and durability features (of the device based thereon). Thus, the present invention is aimed at providing novel (transparent) continuous perovskite patterns, processes for their production and uses thereof in the construction of photo/electronic devices (e.g., semitransparent solar cell).

The transparent patterned arrangements of perovskite materials according to the present invention may comprise thin lines of the material, perovskite or perovskite precursor solution, surrounding two-dimensional voids of various shapes. The voids refer to areas not covered by the perovskite material. The voids can have various shapes such as squares, circles or any irregular shape, or may generally have the shape of a grid. These perovskite patterns can be obtained by direct printing of perovskite or perovskite precursor solution to form grids, by self-assembly of perovskite or perovskite precursor solution into a mesh or a grid, or by any other method which results in transparent structures, such as utilizing perovskite nanowires or combining volatile emulsions with perovskite material.

Thus, the invention provides in one of its aspects a continuous material pattern, wherein the pattern is selected to have a plurality of material-free voids (or confined regions), the material comprising at least one perovskite material.

In another aspect, the invention provides a transparent continuous perovskite pattern defined by material-free voids (or confined regions).

In a further aspect, the invention provides a pattern comprising a transparent or semi-transparent continuous perovskite pattern.

In another aspect, the invention provides a pattern comprising of a continuous perovskite pattern, wherein the pattern being defined by a plurality of intersecting wire-like element(s), said element(s) defining confined regions (voids) enclosed by walls of said intersecting wire-like elements, wherein said wire-like elements are of at least one perovskite material.

In a further aspect, the invention provides a grid pattern overlaying at least one surface region, the pattern being comprised or consists of at least one perovskite material. In some embodiments, the grid pattern is defined by a plurality of intersecting line-like element(s), said element(s) defining confined regions (voids) enclosed by walls of said intersecting line-like elements.

As used herein, the term "pattern" refers to a shape formed of a material, i.e., at least one perovskite material, wherein the shape is selected to have at least one material-free void (or confined regions). Typically, a pattern of the invention comprises a plurality (more than one) of material-free voids (or confined regions). The "material-free voids" are empty cells (in some embodiments, empty from the patterning material) or holes or openings in the patterned material (e.g., perovskite material), through which the substrate or an underlining layer is exposed. The voids are separated by walls of the pattern material which forms a continuous pattern.

The pattern (e.g., of a perovskite material) is substantially a network of thin lines between the material-free voids (the voids being substantially free of the pattern material). In some embodiments, the material-free voids are free, empty, of a perovskite material, but may contain (fully contain of or partially contain of) at least one other non-perovskite material. Thus, in such embodiments, the voids may be regarded as regions of a different material, said material being different from a perovskite material.

The terms "network of thin lines", "intersecting line-like" and "intersecting wire-like" may be used interchangeably and encompass any shape of lines which creates material-free voids or confined regions. The lines may be straight lines, may be curved lines, may be lines with any irregular, symmetric or unsymmetric orientation or shape, or may have substantially the same dimensions (width) throughout the line length or with a varying width. The lines may be a region (intersecting regions), optionally in a geometrical shape (square, circle, triangle, pentagon, hexagon, etc.) or an abstract shape.

In some embodiments, the thin lines in said network, being horizontal and vertical straight lines, create square confined regions. In some embodiments, the thin lines are curved lines, which may create geometrical confined regions, such as polygon confined regions (triangle, pentagon, hexagon, etc). In some embodiments, the thin lines are intersecting regions of irregular shape, which may create irregular shape confined regions or circles.

In some embodiments, the thin lines are arranged so as to provide a grid of squares. In some embodiments, the thin lines are arranged so as to provide a grid (screen) of circles. In some embodiments, the thin lines are arranged so as to provide a grid (screen) of hexagons. In some embodiments, the thin lines are arranged so as to provide a honeycomb-like structure.

In some embodiments, the thin lines comprise a plurality (two or more) of different lines. In some embodiments, the thin lines comprise more than one grid structure (e.g., one region of the network may be in the form of a grid of circles, while another may be a grid of squares).

The dimensions of the voids, as well as the line dimensions are controllable dimensions and the dimensions may be as small or as large as desired. The void average diameter may be less than 1,000 micrometer. In some embodiments, the void diameter is less than 500 micrometer. In some embodiments, the void diameter is less than 300 micrometer. In some embodiments, the void diameter is less than 100 micrometer. In some embodiments, the void diameter is less than 50 micrometer. In some embodiments, the void diameter is less than 30 micrometer. In some embodiments, the void diameter is less than 20 micrometer. In some embodiments, the void diameter is less than 10 micrometer. In some embodiments, the void diameter is less than 5 micrometer.

In some embodiments, the void average diameter is between 1 and 1,000 micrometers. In some embodiments, the void diameter is between 20 and 1,000 micrometers. In some embodiments, the void diameter is between 10 and 300 micrometers. In some embodiments, the void diameter is between 1 and 300 micrometers. In some embodiments, the void diameter is between 5 and 300 micrometers. In some embodiments, the void diameter is between 10 and 300 micrometers. In some embodiments the void diameter is between 50 and 500 micrometers. In some embodiments, the void diameter is between 50 and 300 micrometers.

The average line width (the wall thickness) may be less than 50 micrometers. In some embodiments, the line width is less than 20 micrometers. In some embodiments, the line width is less than 10 micrometers. In other embodiments, the line width is less than 5 micrometers.

The average line width may be between 0.1 and 100 micrometers. In some embodiments, the line width is between 0.5 and 100 micrometers. In some embodiments, the line width is between 0.1 and 50 micrometers. In some embodiments, the line width is between 0.5 and 50 micrometers. In some embodiments, the line width is between 0.5 and 30 micrometers. In other embodiments, the line width is between 5 and 30 micrometers. In some embodiments, the line width is between 1 and 20 micrometers. In some embodiments, the line width is between 5 and 20 micrometers.

The average line height may be less than 100 micrometers. In some embodiments, the line height is less than 50 micrometer. In some embodiments, the line height is less than 20 micrometer. In other embodiments, the line height is less than 10 micrometer. In some embodiments, the line height is less than 5 micrometer. In some embodiments, the line height is less than 1 micrometer.

The average line height may be between 0.1 and 100 micrometers. In some embodiments, the line height is between 0.1 and 50 micrometer. In some embodiments, the line height is between 0.1 and 10 micrometers. In some embodiments, the line height is between 0.1 and 5 micrometers. In some embodiments, the line height is between 0.5 and 100 micrometer. In some embodiments, the line height is between 0.5 and 50 micrometer. In some embodiments, the line height is between 0.5 and 10 micrometer. In some embodiments, the line height is between 0.5 and 5 micrometer.

The material-free voids (or confined regions) may be of any desired shape. The shape may be triangle, square, pentagon, hexagon, diamond, circle, ellipse, etc. In some embodiments, the voids are rectangular or generally square. In some embodiments, the shape is a polygon. The polygon may have 3, 4, 5, 6, 7, 8, 9, 10 or more faces.

The shape of the material-free voids (confined regions) may be abstract, namely having an asymmetric undefined shape or of a defined shape. Each or some of the voids in the pattern may substantially be the same or may be selected to be different from other voids in the same pattern. The pattern or shape of the material-free voids (confined regions) may be random or repetitive.

The pattern of the invention may be a continuous pattern, namely each point along the pattern lines is connected, by some path of the pattern lines, to each of the other points in the pattern. The pattern may have discrete or discontinued regions; however, at least one pattern must be continuous.

In some embodiments, the pattern may be a continuous network or grid (mesh). The pattern may be defined by the extent of coverage of the pattern material of the overall area of the pattern or the area the pattern covers (e.g., substrate or active layer). This parameter determines or influences the transparency of the pattern.

In some embodiments, the pattern material coverage is less than 70%. In some embodiments, the pattern material coverage is less than 60%. In some embodiments, the pattern material coverage is less than 50%. In some embodiments, the pattern material coverage is less than 40%. In some embodiments the pattern material coverage, is less than 30%. In some embodiments, the pattern material coverage is less than 20%.

In some embodiments, the pattern material coverage is between 70% and 10%. In some embodiments, the pattern material coverage is between 60% and 10%. In some embodiments, the pattern material coverage is between 60% and 20%. In some embodiments, the pattern material coverage is between 60% and 30%. In some embodiments, the pattern material coverage is between 50% and 20%. In some embodiments the pattern material coverage is between 50% and 30%.

The pattern may be semi-transparent or transparent.

In some embodiments, the pattern of the invention is conductive.

In some embodiments, the substrate is conductive and transparent.

In some embodiments, the pattern is semi-transparent or transparent to all wavelengths used in any one end application. In some embodiments, the pattern is semi-transparent or transparent to all wavelengths used in a solar cell. In some embodiments, the pattern is semi-transparent or transparent to all wavelengths used in a light emitting diode.

In some embodiments, the pattern is semi-transparent or transparent in the visible spectral regime. In some embodiments, the pattern is semi-transparent or transparent in the NIR and/or IR spectral regime. In some embodiments, the pattern is semi-transparent or transparent in the visible-IR spectral regime.

In some embodiments, the pattern has light transparency (or average light transparency) of at least 20%, at least 30%, at least 40%, at least 50%, at least 60%, at least 70%, at least 80%, at least 85%, at least 90%, at least 95% or at least 97% transparency (e.g., in visible light and/or IR spectral regime).

In some embodiments, the pattern has light transparency of between 15% and 97%. In some embodiments, the pattern has a light transmittance of between 15% and 95%. In some embodiments, the pattern has a light transmittance of between 15% and 90%. In some embodiments, the pattern has a light transmittance of between 15% and 80%. In some embodiments, the pattern has a light transmittance of between 20% and 80%. In some embodiments, the pattern has light transparency of between 15% and 70%. In some embodiments, the pattern has a light transmittance of between 20% and 70%. In some embodiments, the pattern has a light transmittance of between 30% and 70%. In some embodiments, the pattern has a light transmittance of between 15% and 60%. In some embodiments, the pattern has a light transmittance of between 15% and 50%. In some embodiments, the pattern has a light transmittance of between 15% and 40%.

The pattern of the invention is made of one or more "perovskite material". The perovskite material which may be used in accordance with the invention comprises or consists one or more perovskite species, encompassing any perovskite structure known in the art. The perovskite material is typically characterized by the structural motif $AMX_3$, having a three-dimensional network of corner-sharing $MX_6$ octahedra, wherein M is a metal cation that may adopt an octahedral coordination of the X anions, and wherein A is a cation typically situated in the 12-fold coordinated holes between the $MX_6$ octahedra.

In some embodiments, A and M are metal cations, i.e., the perovskite material is a metal oxide perovskite material. In other embodiments, A is an organic cation and M is a metal cation, i.e., the perovskite material is an organic-inorganic perovskite material.

The organic-inorganic perovskite material is an organic-inorganic hybrid structure. The organic-inorganic material encompasses self-assembled arrangements as alternate sheets (in a defined pattern of the invention), wherein the electronic coupling between the sheets and their distance from each other control the electronic properties. The organic-inorganic perovskite structure of the invention encompasses any such structure known in the art.

The organic component may consist of a plurality of sheets, one or more, each comprising organic cations. In some embodiments, the organic component is composed of a single organic sheet (e.g., mono-ammonium), the cations and halogens being in one inorganic sheet, with the organic groups extending into a space between the inorganic sheets. In other embodiments, where the organic component is composed of two sheets (e.g., di-ammonium cations), the molecules extend into the distance between the organic sheets.

The organic groups may comprise an alkyl chain or a single-ring aromatic group. These organic layers help define the degree of interaction between the inorganic sheets and the properties developing in the inorganic sheets. These important modifications may be the result of varying the stoichiometry or composition of the organic and inorganic salts in the precursors solution used to grow the films or crystals (in a defined pattern of the invention). The layered (multiple sheets) perovskite described demonstrates that the inorganic sheets can determine the formation of single crystalline layers, which would achieve higher mobilities (higher electron and holes mobilities).

In some embodiments, the structure of the organic-inorganic perovskites resembles a multilayer structure, with semiconducting inorganic sheets alternating with organic sheets. The organic sheets may have a large energy gap.

In some embodiments, the conduction band of the inorganic sheets is substantially below that of the organic sheets, and the valence band of the inorganic sheets may be similarly above that of the organic sheets, forming a type I band structure. In some embodiments, the band gaps of the organic and inorganic sheets may be in a staggered configuration forming type II band structure.

In some embodiments, the perovskite material is a three-dimensional material. In some embodiments, the perovskite material is a two-dimensional material.

In some embodiments, the perovskite material is of the formula $AMX_3$ or $AMX_4$ or $A_2MX_4$ or $A_3MX_5$ or $A_2A'MX_5$ or $AMX_{3-n}X'_n$, wherein, in each of the above formulae, independently:

each A and A' are independently selected from organic cations, metal cations and any combination of such cations;

M is a metal cation or any combination of metal cations;

each X and X' are independently selected from anions and any combination of anions; and n is between 0 to 3.

Repeating or multiple elements in any of the above perovskite formulae (e.g., $A_2$ or $X_4$ in $A_2MX_4$) may be the same or different. For example, $A_2MX_4$ may be of the structure AA'MXX'X"X"'.

The cation and anion moieties may be in any valence number. In some embodiments, the cation and/or the anion have a valence number of 1 or 2 or 3 or 4 or 5 or 6 or 7. In some embodiments, the cation and/or the anion is a monovalent atom. In some embodiments, the cation and/or the anion is a divalent atom. In some embodiments, the cation and/or the anion is a trivalent atom.

The metal cations may be selected from metal element of Groups IIIB, IVB, VB, VIB, VIIB, VIIIB, IB, IIB, IIIA, IVA and VA of block d of the Periodic Table of the Elements.

In some embodiments, the metal cation is Li or Mg or Na or K or Rb or Cs or Be or Ca or Sr or Ba, Sc or Ti or V or Cr or Fe or Ni or Cu or Zn or Y or La or Zr or Nb or Tc or Ru or Mo or Rh or W or Au or Pt or Pd or Ag or Co or Cd or Hf or Ta or Re or Os or Ir or Hg or B or Al or Ga or In or Tl or C or Si or Ge or Sn or Pb or P or As or Sb or Bi or O or S or Se or Te or Po or any combination thereof.

In some embodiments, the metal cation is a transition metal selected from Groups IIIB, IVB, VB, VIB, VIIB, VIIIB, IB and IIB of block d the Periodic Table. In some embodiments, the transition metal is a metal selected from Sc, Ti, V, Cr, Mn, Fe, Ni, Cu, Zn, Y, Zr, Nb, Tc, Ru, Mo, Rh, W, Au, Pt, Pd, Ag, Mn, Co, Cd, Hf, Ta, Re, Os, Ir and Hg or any combination thereof.

In some embodiments, the metal cation is a post-transition metal selected from Group IIIA, IVA and VA. In some embodiments, the metal cation is Al or Ga or In or Tl or Sn or Pb or Bi or any combination thereof.

In some embodiments, the metal cation is a semi-metal selected from Group IIIA, IVA, VA and VIA. In some embodiments, the metal cation is B or Si or Ge or As or Sb or Po or any combination thereof.

In some embodiments, the metal cation is an alkali metal selected from Group IA. In some embodiments, the metal cation is an alkali metal Li or Mg or Na or K or Rb or Cs.

In some embodiments, the metal cation is an alkaline earth metal selected from Group IIA. In some embodiments, the metal cation is Be or Ca or Sr or Ba.

In some embodiments, the metal cation is a lanthanide element such as Ce or Pr or Gd or Eu or Tb or Dy or Er or Tm or Nd or Yb or any combination thereof.

In some embodiments, the metal cation is an actinides element such as Ac or Th or Pa or U or Np or Pu or Am or Cm or Bk or Cf or Es or Fm or Md or No or Lr or any combination thereof.

In some embodiments, the metal cation is a divalent metal cation. Non-limiting examples of divalent metals include $Cu^{+2}$, $Ni^{+2}$, $Co^{+2}$, $Fe^{+2}$, $Mn^{+2}$, $Cr^{+2}$, $Pd^{+2}$, $Cd^{+2}$, $Ge^{+2}$, $Sn^{+2}$, $Pb^{+2}$, $Eu^{+2}$ and $Yb^{+2}$.

In some embodiments, the metal cation is a trivalent metal cation. Non-limiting examples of trivalent metals include $Bi^{+3}$ and $Sb^{+3}$.

In some embodiments, the metal cation is $Pb^{+2}$.

The organic cations comprise at least one organic moiety (containing one or more carbon chain or hydrocarbon chain or one or more organic group). The organic moiety may be selected from substituted or unsubstituted alkyl, substituted or unsubstituted alkenyl, substituted or unsubstituted alkynyl, substituted or unsubstituted cycloalkyl, substituted or unsubstituted cycloalkenyl, substituted or unsubstituted cycloalkynyl, substituted or unsubstituted aryl, substituted or unsubstituted heteroaryl, substituted or unsubstituted heterocyclyl, substituted or unsubstituted —$NR_1R_2$, substituted or unsubstituted —$OR_3$, substituted or unsubstituted —$SR_4$, substituted or unsubstituted —$S(O)R_5$, substituted or unsubstituted alkylene-COOH, and substituted or unsubstituted ester.

The variable group denoted by "R", in any one of the generic descriptions e.g., —$NR_1R_2$, —$OR_3$, —$SR_4$, —$S(O)R_5$, refers to one or more group selected from hydrogen, alkyl, alkenyl, alkynyl, cycloalkyl, cycloalkenyl, cycloalkynyl, aryl, heteroaryl, heterocyclyl, halogen, alkylene-COOH, ester, —OH, —SH, and —NH, as defined herein or any combination thereof. In some embodiments, the number of R groups may be 0 or 1 or 2 or 3 or 4 or 5 or 6 or 7 or 8 or 9 or 20. As used herein, the group R refers generically to any specific R used herein, unless a specific definition is provided; in other words, the aforementioned definition refers to any of the R groups, e.g., R', R'', R''', R'''', $R_2$, $R_3$, $R_4$, $R_5$, $R_6$, $R_7$, $R_8$, etc., unless otherwise specifically noted.

In some embodiments, the perovskite material is a single species of a perovskite material. In other embodiments, the perovskite material is a combination of two or more (several) different species of different perovskite materials. In some embodiments, the number of different species of different perovskite materials may be 2 or 3 or 4 or 5 or 6 or 7 or 8 or 9 or 10 perovskite different perovskite species.

In some embodiments, the perovskite material, in a defined pattern of the invention, is a multilayer structure of layered perovskite materials, wherein each layer is different and comprises either a different species of a perovskite material, or a different mixture of several different species of perovskite materials. In some embodiments, each layer in a perovskite multilayer is made of a different combination or the same combination but with different ratios of perovskite materials.

In some embodiments, where the perovskite material is in a form of a multilayered perovskite material, each of the perovskite layers in the multilayer may be of the same perovskite material or of different perovskite materials. In some embodiments, the multilayer perovskite comprises 2 or 3 or 4 or 5 or 6 or 7 or 8 or 9 or 10 perovskite layers.

In some embodiments, the perovskite material comprises 2 or 3 or 4 or 5 or 6 or 7 or 8 or 9 or 10 different perovskite materials, each being selected and defined as above.

In some embodiments, the perovskite material comprises two perovskite materials at a ratio of 1:1 or 1:2 or 1:3 or 1:4 or 1:5.

In the organic moieties comprising the organic-inorganic hybrid material, the following definitions are applicable:

"alkyl", "alkenyl" and "alkynyl" carbon chains, if not specified, refers to carbon chains each containing from 1 to 20 carbons, or 1 or 2 to 16 carbons, and are straight or branched. Each such group may be substituted. In some embodiments, the carbon chain contains 1 to 10 carbon atoms. In some embodiments, the carbon chain contains 1 to 6 carbon atoms. In some embodiments, the carbon chain contains 2 to 6 carbon atoms. Alkenyl carbon chains may contain from 2 to 20 carbons, or 2 to 18 carbons, or 2 to 16 carbons, or 2 to 14 carbons, or 2 to 12 carbons, or 2 to 10 carbons, or 2 to 8 carbons, or 2 to 6 carbons, or 2 to 4 carbons. The alkenyl carbon chain may similarly contain 1 to 8 double bonds, or 1 to 7 double bonds, or 1 to 6 double bonds, or 1 to 5 double bonds, or 1 to 4 double bonds, or 1 to 3 double bonds, or 1 double bond, or 2 double bonds. Alkynyl carbon chains from 2 to 20 carbons, or 2 to 18 carbons, or 2 to 16 carbons, or 2 to 14 carbons, or 2 to 12, or carbons 2 to 10 carbons, or 2 to 8 carbons, or 2 to 6 carbons, or 2 to 4 carbons. The alkynyl carbon chain may similarly contain 1 to 8 triple bonds, or 1 to 7 triple bonds, or 1 to 6 triple bonds, or 1 to 5 triple bonds, or 1 to 4 triple bonds, or 1 to 3 triple bonds, or 1 triple bond, or 2 triple bonds. Exemplary alkyl, alkenyl and alkynyl groups include, but are not limited to, methyl, ethyl, propyl, isopropyl, isobutyl, n-butyl, sec-butyl, tert-butyl, isohexyl, allyl (propenyl) and propargyl (propynyl).

"cycloalkyl" refers to a saturated mono- or multi-cyclic ring system, in certain embodiments of 3 to 10 carbon atoms, in other embodiments 3 to 6 carbon atoms; cycloalkenyl and cycloalkynyl refer to mono- or multicyclic ring systems that respectively include at least one double bond and at least one triple bond. Cycloalkenyl and cycloalkynyl groups may, in some embodiments, may contain between 3 to 10 carbon atoms, in further embodiments, between 4 to 7 carbon atoms and cycloalkynyl groups, in further embodiments, containing 8 to 10 carbon atoms. The ring systems of the cycloalkyl, cycloalkenyl and cycloalkynyl groups may be composed of one ring or two or more rings which may be joined together in a fused, bridged or spiro-connected fashion.

"aryl" refers to aromatic monocyclic or multicyclic groups containing from 6 to 10 carbon atoms. Aryl groups include, but are not limited to groups such as unsubstituted or substituted fluorenyl, unsubstituted or substituted phenyl, and unsubstituted or substituted naphthyl.

"heteroaryl" refers to a monocyclic or multicyclic aromatic ring system, in certain embodiments, of about 5 to about 15 members where one or more, in some embodiments 1 to 3, of the atoms in the ring system is a heteroatom, that is, an element other than carbon, including e.g., nitrogen, oxygen or sulfur. The heteroaryl group may be optionally fused to a benzene ring. Heteroaryl groups include, but are not limited to, furyl, imidazolyl, pyrimidinyl, tetrazolyl, thienyl, pyridyl, pyrrolyl, thiazolyl, isothiazolyl, oxazolyl, isoxazolyl, triazolyl, quinolinyl and isoquinolinyl.

"heterocyclyl" refers to a saturated mono- or multi-cyclic ring system, in one embodiment of 3 to 10 members, in another embodiment of 4 to 7 members, in a further embodiment of 5 to 6 members, where one or more, in certain embodiments, 1 to 3, of the atoms in the ring system is a heteroatom, that is, an element other than carbon, including but not limited to, nitrogen, oxygen or sulfur. In embodiments where the heteroatom(s) is nitrogen, the nitrogen is optionally substituted with alkyl, alkenyl, alkynyl, aryl, heteroaryl, aralkyl, heteroaralkyl, cycloalkyl, heterocyclyl, cycloalkylalkyl, heterocyclylalkyl, acyl, guanidine, or the nitrogen may be quaternized to form an ammonium group where the substituents are selected as above.

"—$NR_1R_2$" refers to an amine group wherein $R_1$ and $R_2$ are independently selected from hydrogen, alkyl, alkenyl, alkenyl, cycloalkyl, cycloalkenyl, cycloalkynyl, aryl, heteroaryl, heterocyclyl, ester and carbonyl, each as defined herein or alternatively known in the art.

"—$OR_3$" refers to a hydroxyl group or an alkoxy group or derivative, wherein $R_3$ is selected from hydrogen, alkyl, alkenyl, alkenyl, cycloalkyl, cycloalkenyl, cycloalkynyl, aryl, heteroaryl, heterocyclyl, halogen, sulfinyl, ester and carbonyl.

"—$SR_4$" refers to a thiol group or a thioether group or derivative, wherein $R_4$ is selected from hydrogen, alkyl, alkenyl, alkenyl, cycloalkyl, cycloalkenyl, cycloalkynyl, aryl, heteroaryl, heterocyclyl, halogen, sulfinyl, ester and carbonyl.

"—$S(O)R_5$" refers to a sulfinyl group, wherein $R_5$ is selected from hydrogen, alkyl, alkenyl, alkenyl, cycloalkyl, cycloalkenyl, cycloalkynyl, aryl, heteroaryl, heterocyclyl, halogen, sulfinyl, ester and carbonyl.

"ester" refers to —$C(O)OR_8$ in which $R_8$ is selected from hydrogen, alkyl, alkenyl, alkenyl, cycloalkyl, cycloalkenyl, cycloalkynyl, aryl, heteroaryl, heterocyclyl, halogen, —$NR_1R_2$, sulfinyl, carbonyl, —$OR_3$, $SR_4$, —$S(O)R_5$, —OH, —SH and —NH.

The term "substituted" refers to any group or any ligand as defined herein above having (further substituted) one or more substituent, wherein the substituent is a ligand as defined herein above. In some embodiments, the substituent is selected from alkyl, alkenyl, alkynyl, cycloalkyl, cycloalkenyl, cycloalkynyl, aryl, heteroaryl, heterocyclyl, halogen, alkylene-COOH, ester, —OH, —SH, and —NH. In some embodiments, the number of substituents on a certain ligand is 0 or 1 or 2 or 3 or 4 or 5 or 6 or 7 or 8 or 9 or 20 substituents.

The anion may be a simple anion or a halide anion or a chalcogenide anion or an organic anion or an oxoanion or any combination thereof.

In some embodiments, the anion is a simple anion, such as $O^{-2}$, $N^{-3}$, $S^{-2}$ or any combination thereof.

In some embodiments, the anion is a halide anion, wherein the halide may be F, Cl, Br, I, At or any combination thereof.

In some embodiments, the anion is selected from anions of an atom selected from S, Se, Te and any combination thereof.

In some embodiments, the anion is selected amongst organic anions such as acetate ($CH_3COO^-$), formate ($HCOO^-$), oxalate ($C_2O_4^{-2}$), cyanide ($CN^-$) or any combination thereof.

In some embodiments, the anion is an oxoanion such as $AsO_4^{-3}$, $AsO_3^{-3}$, $CO_3^{-2}$, $HCO_3^-$, $OH^-$, $NO_3^-$, $NO_2^-$, $PO_4^{-3}$, $HPO_4^{-2}$, $SO_4^{-2}$, $HSO_4^-$, $S_2O_3^{-2}$, $SO_3^{-2}$, $ClO_4^-$, $ClO_3^-$, $ClO_2^-$, $OC^-$, $IO_3^-$, $BrO_3^-$, $OBr^-$, $CrO_4^{-2}$, $Cr_2O_7^{-2}$ or any combination thereof.

In some embodiments, the anion may be selected from $Br^-$, $I^-$, $NCS^-$, $CN^-$, and $NCO^-$. In further embodiments, the anion may be selected from $IBr^{-3}$, $Cl_2I^{-3}$, $Br_2I^{-3}$ and $I_2Cl^{-3}$.

In some embodiments, the perovskite material is an organic-inorganic perovskite structure. In some embodiments, the organic-inorganic perovskite structure is selected from (R—$NH_3$)$_2MX_4$ and (NH—R—NH)MX; (wherein X may be $Cl^{-1}$, $Br^{-1}$, or $I^{-1}$). The inorganic layers may consist of sheets of corner-sharing metal halide octahedra. The M cation may be a divalent or trivalent metal that satisfies charge balancing and adopts octahedral anion coordination.

The inorganic layers, usually referred to as perovskite sheets, are derived from the three dimensional $AMX_3$ perovskite structure, by typically making a one-layer-thick cut along the <100> direction of the three-dimensional crystal lattice. The structural modifications may be achieved by changing the compositions of the organic and inorganic salts in the starting solution to enable tailoring the electronic, optical, and magnetic properties.

In some embodiments, the organic cation is an organic monovalent cation.

In some embodiments, the organic cation is a primary, a secondary, a tertiary or a quaternary organic ammonium compound, including N-containing heterorings and ring systems.

In some embodiments, the organic cation is a carbon (hydrocarbon) chain comprising one or more heteroatoms. The heteroatoms may be selected from N, O and S. In some embodiments, the number of heteroatoms is 1 or 2 or 3.

In some embodiments, the heteroatom is a nitrogen atom.

In some embodiments, the carbon chain comprises one or more halogens.

In some embodiments, the carbon chain comprises a heterocyclyl and/or a heteroaryl.

In some embodiments, the organic cation is a monovalent or a bivalent cation or any other valence number, which may be a primary, a secondary, a tertiary or a quaternary organic ammonium compound having two positively charged nitrogen atoms.

In some embodiments, in a perovskite structure as defined above, the cation (A or A') is an organic cation selected from $(RR'R''R'''N)^+$, wherein each of the R groups may be selected independently as defined herein In some embodiments the cation is selected from $RNH_3$, $RR'NH_2$, $RR'R''NH$, $NH_3RNH_3$ or any combination thereof. In some embodiments, the cation is selected from $RNH=R'$, $NH_2=R$, $RN=R'R''$, $R'=N=R$, $RR'N=R=NR''R'''$, $H_2N=R=NH_2$, $RR'N=CHNR''R'''$. In some embodiments, the cation is $(H_2N=CHNH_2)^+$ or any combination thereof.

In some embodiments, the perovskite material is of the formula $AMX_3$.

In further embodiments, the perovskite material is of the formula $AMX'X_2$.

In yet further embodiments, the perovskite material is of the formula $RNH_3MX'X_2$.

In some embodiments, the perovskite material comprises or is selected from $CH_3NH_3PbF_3$, $CH_3NH_3PbCl_3$, $CH_3NH_3PbI_3$, $CH_3NH_3PbBr_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$ and $CH_3NH_3PbI_2Cl$. In some embodiments, the perovskite material comprises or is selected from $CH_3NH_3SnICl_2$, $CH_3NH_3SnBrI_2$, $CH_3NH_3SnBrCl_2$, $CH_3NH_3SnF_2Br$, $CH_3NH_3SnIBr_2$, $CH_3NH_3SnF_2I$, $CH_3NH_3SnClBr_2$, $CH_3NH_3SnI_2Cl$ and $CH_3NH_3SnF_2Cl$.

In further embodiments, the perovskite material is of the formula $RNH_3MX_3$. In some embodiments, the perovskite material comprises or is selected from $CH_3NH_3PbF_3$, $CH_3NH_3PbCl_3$, $CH_3NH_3PbI_3$ and $CH_3NH_3PbBr_3$. In some embodiments, the perovskite material is $CH_3NH_3PbI_3$.

In further embodiments, the perovskite material is of the formula $(NH_2=CH-NH_2)$ $MX_3$. In some embodiments, the perovskite material comprises or is selected from $(NH_2=CH-NH_2)PbBr_3$, $(NH_2=CH-NH_2)PbI_3$, $(NH_2=CH-NH_2)PbCl_3$, $(NH_2=CH-NH_2)$ $PbFCl_2$, $(NH_2=CH-NH_2)PbBrCl_2$, $(NH_2=CH-NH_2)PbICl_2$, $(NH_2=CH-NH_2)PbFCl_2$, $(NH_2=CH-NH_2)PbFBr_2$, $(NH_2=CH-NH_2)PbFI_2$ and $(NH_2=CH-NH_2)PbIBr_2$.

In further embodiments, the perovskite material is of the formula $AMX_3$, wherein M is metal cation, i.e., $M'MX_3$. In further embodiments, the perovskite material is of the formula $M'MX'X_2$. In some embodiments, the perovskite material comprises or is selected from $CsPbI_2Cl$, $CsPbICl_2$, $CsPbI_2F$, $CsPbIF_2$, $CsPbI_2Br$ and $CsPbIBr_2$.

In some embodiments, the perovskite material comprises or is selected from $CsSnI_2F$, $CsSnIF_2$, $CsSnI_2Cl$, $CsSnICl_2$, $CsSnI_2Br$ and $CsSnIBr_2$.

In further embodiments, the perovskite material is $CH_3NH_3PbI_3$.

In another aspect, the invention provides a process for producing a continuous perovskite pattern, the process comprising:

providing a substrate, the substrate having on at least one region thereof a patterning device defined by a plurality of intersecting wire-like element(s), said element(s) being optionally of a material different from the material of the substrate, and defining confined regions (material-free voids) enclosed by walls of said intersecting wire-like elements (a mesh);

placing a solution of a perovskite material or a solution of perovskite precursors in at least one confined region on said substrate;

allowing migration of the perovskite material or perovskite precursors to the walls of said confined region (voids) to form a pattern having substantially the contour of said confined region; and optionally treating (e.g., annealing) said pattern.

The continuous pattern of the invention may be defined by the contour of the plurality of intersecting wire-like element(s) or lines of the patterning device. The pattern/shape of the resulting perovskite pattern formed by the process of the invention is thus at least similar in pattern/shape to at least part of the pattern/shape of the patterning device.

In some embodiments, the "patterning device" is a grid-like patterning device (screen, lattice mash) covering at least a region of the substrate. The grid-like patterning device may be of any shape and size. The intersecting wire-like elements defining the grid-like patterning device have a height above the top surface of the substrate or layer on which a pattern may be formed, thus forming the material-free voids or confined regions (voids confined by the walls of the wire-like elements). The wire elements may be straight and/or parallel to each other, or may be randomly oriented, or may be of any shape and at any angle to a neighboring element or to the edge of the substrate, such that their intersecting points form confined regions in the shape(s) of circles, squares, triangles, pentagons, hexagons, and/or others, or any combination thereof. In some embodiments, the shape of the regions is geometrically undefined.

In some embodiments, the average dimension (longest axis) or diameter of an average confined enclosure defined by walls (confined regions) of the wire-like elements is greater than about 0.01 µm. In some embodiments, the average dimension is in the range of about 0.01 µm to about 1000 µm. In some embodiments, the average dimension is in the range of about 1 µm to about 500 µm. In some embodiments, the average dimension is in the range of about 1 µm and about 300 µm. In other embodiments, the average dimension is in the range of about 10 µm to about 300 µm. In other embodiments, the average dimension is in the range of about 10 µm to about 100 µm. In other embodiments, the average dimension is below about 50 µm. In other embodiments, the average dimension is about 50 µm.

The "wire-like elements" (or lines) may have any width, length or height, depending on the nature of the pattern to be formed on the substrate. In some embodiments, the width of each such wire-like element is greater than about 0.01 µm. In some embodiments, the width of each such wire-like element is greater than about 0.1 µm. In some embodiments, the width is between about 0.1 µm to about 300 µm. In some embodiments, the width is between about 1 µm to about 300 µm. In other embodiments, the width is between about 1 to about 10 µm. In further embodiments, the width is between about 0.1 to about 1 µm.

In additional embodiments, the average width of a wire-like element is between about 5 to about 10 µm.

In some embodiments, the height of a wire-like element is greater than 10 nm. In some embodiments, the height of a wire-like element is greater than 30 nm. In other embodiments, the height is greater than 0.1 µm. In some embodiments, the height is between about 30 nm to about 100 µm. In some embodiments, the height is between about 100 nm to about 10 µm.

In further embodiments, the height is between about 800 nm to about 1,300 nm.

The wire-like elements constituting the patterning device (grid, screen) may be comprised of any material. In some embodiments, the material from which the device is made is different from the substrate or layer on which a pattern may be formed. In further embodiments, the material is selected to decompose under etching conditions which do not affect the integrity of the substrate or layer on which a pattern may be formed. In further embodiments, the material may be washed off the substrate or layer on which a pattern may be formed.

The material of the patterning device may be of any chosen material. In some embodiments, the material of the patterning device (e.g., grid) comprises at least one of the following materials: a metallic material, an insulator material, a polymeric material, and a carbon-based material. In some embodiments, the material of the patterning device is of a metallic material or comprises a metallic material, said metallic material being selected from iron, copper, titanium, platinum, stainless steel, carbon, aluminum and nickel.

In some embodiments, the material of the patterning device is stainless steel mesh.

In some embodiments, the material of the patterning device is a polymeric material. In some embodiments, the material of the patterning device is polyester.

In some embodiments, the patterning device is formed on a substrate by a process of material deposition forming a pre-defined blueprint.

In other embodiments, the patterning device is a self-standing (removable, detachable, preformed) device such as a screen or grid or mesh (defined by a plurality of material voids, holes) which is placed on the substrate and which may be removed therefrom subsequent to the forming of the perovskite pattern or subsequent to any step thereafter, e.g., prior to or subsequent to annealing.

Thus, the process comprising:
providing a substrate;
placing on a region of said substrate a patterning device (grid, screen, mesh);
placing a dispersion of a perovskite material or a solution of perovskite precursors on said substrate;
allowing migration of the perovskite material or perovskite precursors to the walls of said voids to form a perovskite material or perovskite precursors pattern having substantially the contour of said voids; and after removal
optionally post treating (e.g., annealing) said pattern of perovskite material or perovskite precursors.

In some embodiments, the patterning device is lifted from the substrate prior to post treatment (e.g. annealing) to permit further migration of the perovskite material or perovskite precursors.

In further embodiments, prior to post-treatment, the process further comprises the step of permitting evaporation of the solution medium (solvent/solvents) in which the perovskite material or the perovskite precursors are contained. In some embodiments, the solution medium is permitted to dry completely.

In some embodiments, the patterning device is lifted or removed after post treatment (e.g., annealing).

As used herein, the post-treatment may include thermally treating the formed pattern to permit annealing. The thermal treatment may comprise heating the pattern to above 50° C. In some embodiments, thermal treatment comprises heating the pattern to between 50° C. and 400° C. In some embodiments, thermal treatment comprises heating the pattern to between 50° C. and 200° C. In some embodiments, thermal treatment comprises heating the pattern to between 70° C. and 200° C. In some embodiments, thermal treatment comprises heating the pattern to between 100° C. and 200° C. In some embodiments, thermal treatment comprises heating the pattern to between 100° C. and 150° C. In some embodiments, the thermal treatment comprises heating the pattern to between 50° C. and 100° C. In some embodiments, thermal treatment comprises heating the pattern to between 70° C. and 150° C. In some embodiments, thermal treatment comprises heating to 90° C. In some embodiments, thermal treatment comprises heating to 70° C.

In some embodiments, the substrate and/or the patterning device, being a self-standing device (screen or grid) are subjected to a pre-treatment procedure, prior to placing the patterning device on a substrate. The pre-treatment may include solvent or chemical washing or physical washing (e.g., by a non-liquid medium such as a gas), etching, heating, plasma treatment (e.g., oxygen plasma), UV-ozone treatment, corona discharge, laser or microwave irradiation, flash lamp (Xenon) electroless plating, coating by a protective layer, or any combination thereof.

In some embodiments, pre-treatment is applied to the patterning device and/or substrate, prior to their use. In some embodiments, the pre-treatment comprises plasma treatment. In further embodiments, the plasma treatment involves oxygen plasma.

As used herein, the self-standing patterning device may be pre-made in any desired shape, and therefore provides a manner to control and pre-determine, with a high accuracy, the final shape and dimensions of the pattern to be formed on the substrate.

The perovskite layer is provided on a "substrate" which may be a flexible or rigid substrate, which may be substantially two-dimensional (a thin flat substrate) or a three-dimensional curved (non-flat) surface. The substrate may be of any smoothness. In most general terms, the substrate may be of a solid material such as glass, paper, a semiconductor inorganic or organic, a polymeric material or a ceramic surface. The surface material, being the substrate on which the perovskite pattern is formed, may not be of the same material as the bulk of the object on the surface of which the perovskite pattern is produced.

In some embodiments, the substrate is a layer or a coat in a multilayer structure, wherein the perovskite pattern is one of the layers or coats.

In some embodiments, the substrate is a patterned surface region of a non-perovskite material. The perovskite pattern may or may not follow the pattern on top of which it is formed.

In some embodiments, the substrate is flexible.
In some embodiments, the substrate is conductive.
In some embodiments, the substrate is transparent.
In some embodiments, the substrate is transparent to all wavelengths used in the end application. In some embodiments, the substrate is transparent to all wavelengths used in a solar cell. In some embodiments, the substrate is transparent in the visible spectral regime. In some embodiments, the substrate is transparent in the NIR and/or IR spectral regime. In some embodiments, the substrate is transparent in the visible-IR spectral regime.

In some embodiments, the substrate is conductive and transparent.

In some embodiments, the substrate is an inorganic semiconductor material selected from silicon, tin, compounds of boron, tellurium, geranium, gallium, gallium arsenide (GaAs), gallium phosphide (GaP), cadmium telluride (CdTe), gallium aluminum arsenide (GaAlAs), indium phosphide (InP), gallium arsenide phosphide (GaAsP), cadmium sulfide (CdS), copper indium gallium diselenide (CIGS), mercury cadmium telluride (HgCdTe), and copper indium sulfide or selenide.

In some embodiments, the substrate may be selected from glass, porous glass, quartz, indium tin oxide (ITO), fluorinated tin oxide (FTO), antimony doped tin oxide (ATO), mica, $SrGeO_3$ or zinc oxide. In further embodiments, the substrate may be selected from $SnO_2$:F, $SnO_2$:Sb, $In_2SO_3$:Sn, ZnO:Al, $ZnO:Al_2O_3$, $ZnO:Ga_2O_3$.

In some embodiments, the substrate is indium tin oxide (ITO) or fluorinated tin oxide (FTO).

In some embodiments, the substrate is formed of a polymeric material (conductive polymer), such as polyazulenes, polyphenylenes, polypyrenes, polynaphthalenes, polyester (PET), polyimide, poly(pyrrole)s (PPY), poly(thiophene)s (PT), poly(3,4-ethylenedioxythiophene) (PEDOT), polyazepines, polyindoles, polycarbazoles, poly(p-phenylene vinylene) (PPV), poly(acetylene)s (PAC), poly(p-phenylene sulfide) (PPS), poly-3-hexyl thiophene (P3HT) and polyanilines.

In some embodiments, the substrate is a carbon substrate or HOPG (graphite).

In some embodiments, the substrate is or comprises a metal.

In some embodiments, the substrate comprises a transition metal selected from Sc, Ti, V, Cr, Mn, Fe, Ni, Cu, Zn, Y, Zr, Nb, Tc, Ru, Mo, Rh, W, Au, Pt, Pd, Ag, Mn, Co, Cd, Hf, Ta, Re, Os, Ir, Hg and any combination thereof.

In some embodiments, the substrate is a metallic substrate made of a metal selected from gold, silver, copper, platinum, nickel, palladium, titanium, iridium and any combination thereof.

In some embodiments, the substrate is a glass or a plastic substrate composed of a glass material coated with a conductive material such as $SnO_2$:F (FTO) or metal nanoparticles (e.g., Au and/or Ag nanoparticles).

In some embodiments, the substrate may be selected from glass, porous glass, quartz, indium tin oxide (ITO), fluorinated tin oxide (FTO) and mica.

The "solution of perovskite material" refers to a solution or dispersion of one or more perovskite materials in a liquid medium, the medium being any liquid (solvent) in which the perovskite material(s) may be dispersed. The medium may be non-aqueous (organic). In some embodiments, the medium is a mixture of several liquids. In some embodiments, the medium may be an organic solvent, such as, DMF, isopropanol, gamma-butylactone, DMSO, or any combination thereof.

Where the process involves in-situ formation of the perovskite material, the patterning device may be employed for patterning the perovskite precursors on the substrate. In such embodiments, the process of the invention requires the placing of at least one solution (or a medium) of perovskite precursor(s) on the substrate in one or more of the material voids in said patterning device.

In some embodiments, the solution of perovskite precursors comprises all necessary perovskite precursors. In some embodiments, the solution of perovskite precursors comprises at least one metal precursor and at least one organic precursor. In some embodiments, the solution of perovskite precursors comprises only a part of the perovskite precursors. In some embodiments, the solution of perovskite precursors comprises one or more metal precursors. In other embodiments, the solution of perovskite precursors comprises one or more organic precursors.

In some embodiments, the perovskite pattern is formed upon placing the perovskite material on the substrate. In some embodiments, the perovskite pattern is formed on the substrate by placing simultaneously on the substrate one or more solution of a perovskite precursor. In other embodiments, the perovskite pattern is formed on the substrate by placing thereon one or more solutions of a perovskite precursor and subsequently placing one or more other solutions of the same or different perovskite precursor. In other embodiments, the perovskite layer is formed on the substrate by placing thereon one or more solution of a perovskite precursor, the solution comprising at least one metal precursor, and subsequently placing one or more solutions of a perovskite precursor comprising at least one organic precursor, or vice versa.

In some embodiments, the solution of the perovskite material or a solution of perovskite precursors further comprises at least one additive selected from a stabilizing agent(s), a rheological agent, a wetting agent, a buffer, pH adjusting agent, a biocide, a sequestering agent, a chelating agent, a corrosion inhibitor, a humectant, an evaporation control agent, a co-solvent, a fixative, a penetrant and a surfactant.

In some embodiments, the at least one additive is a stabilizing agent being optionally selected from polyacrylic acid salt, polycarboxylate ethers or any other stabilizer.

In some embodiments, the at least one additive is a wetting agent. The wetting agents may be selected, in a non-limiting fashion, from BYK 348, BYK 333, BYK 110, and any other wetting agent.

The placing step may be performed by any protocol and means known in the art. In some embodiments, the means for pattern placement is by coating or deposition. In some embodiments, the coating or deposition means is selected from dipping, spin coating, roll coating, spraying, dispensing, printing, ink-jet printing, lithography, stamping, drop casting and any combination thereof.

In some embodiments, the coating or deposition refers to placing droplets of said dispersion of nanoparticles at desired region(s), by spray coating, printing, inkjet printing, differential roll printing, contact printing, coating, spin coating, or any combination thereof. In some embodiments, the placing step is by printing. In further embodiments, the placing step is by ink jetting.

In some embodiments, the process of the invention enables producing a pattern on a substrate, in accordance with aspects and embodiments of the invention, with controllable height and width, to enable tuning pattern transparency.

In another aspect, the invention provides a continuous perovskite pattern formed according to a process disclosed herein.

The invention also provides an element comprising a substrate, at least one continuous perovskite pattern, at least one conductive layer, and optionally at least one additional layer selected from a scaffold structure layer, at least one hole conductive layer, and at least one additional layer.

In another aspect, the invention provides an element comprising a substrate, a scaffold structure layer, at least one continuous perovskite pattern, optionally at least one conductive layer, and optionally at least one additional layer, wherein said element is devoid of (or free of) a hole conductive layer.

In another aspect, the invention provides an element comprising a substrate, at least one continuous perovskite pattern, optionally at least one conductive layer, and at least one additional layer, wherein said element is devoid of (or free of) a scaffold structure layer.

In some embodiments, the element is semi-transparent or transparent.

In another aspect, the invention provides an element comprising a substrate, a scaffold structure layer, at least one continuous perovskite pattern, a conductive layer, optionally at least one hole conductive layer, and optionally at least one additional layer, wherein the element is semi-transparent or transparent.

The term "layer" used with reference to any of the mono-, bi- or otherwise multilayer structures mentioned herein, is meant to signify a full layer, or film, on top or below a different layer or film, or one or more spaced apart regions of one material covering a different layer of a different material. A pattern may also be referred to as a "layer", or a "patterned layer". The spaced apart regions may be regions of a material(s) (layer and/or stacked layers or patterns) separated by a region(s) of atoms (material) of a different material or other layer or stacked layers or material-free region(s). In some embodiments, the layer is a partial layer. In some embodiments the partial layer is continuous or comprising separate regions (spaced apart, non-connected).

In some embodiments, the conductive layer partially covers the perovskite pattern or one or more additional layer(s). In some embodiments, the perovskite pattern partially covers the substrate.

The layers of the invention (all or some), including stacked layers, may be in a certain pattern on the substrate. The pattern may be repetitive or random. The pattern may be of any shape, e.g., repetitive or non repetitive cubes, rings, circles, strips, grid. The pattern size may be in the nanometer scale or in the micrometer scale or in the millimeter scale. The pattern feature may be as defined above.

In some embodiments, the at least one conductive layer is at least one (continuous) conductive pattern. In some embodiments, the at least one conductive layer is at least one (continuous) hole conductive pattern. In some embodiments, the at least one additional layer is at least one (continuous) additional pattern. In some embodiments, the at least one additional layer and the at least one conductive layer are (continuous) patterned.

In some embodiments, all layers in the element are patterned.

The different patterns may be stacked on each other. Each pattern may follow the contour lines of a previous pattern and may have substantially or about the same dimensions. The patterns may be stacked in a concentric way.

In some embodiments, the conductive pattern is stacked on (or positioned below) the perovskite pattern, concentrically. In some embodiments, the additional pattern is stacked on the perovskite pattern, or vice versa, concentrically. In some embodiments, the conductive pattern, the additional pattern, the perovskite pattern are stacked concentrically.

In some embodiments, at least one layer or pattern or all of the layers or patterns is flexible.

In some embodiments, at least one layer or pattern or all of the layers or patterns is semi-transparent or transparent. In some embodiments, at least one layer or pattern or all of the layers or patterns is conductive.

A scaffold structure layer may be positioned on top of the substrate.

In some embodiments, the scaffold layer is in the form of a continuous pattern.

In some embodiments, the scaffold pattern and the perovskite pattern are stacked on each other. In some embodiment, they are stacked concentrically. Each pattern may follow the contour lines of a previous pattern and may have substantially or about the same dimensions.

In some embodiments, the scaffold may be replaced with a flat film of a metal oxide.

In some embodiments, the at least one scaffold layer comprises a metal oxide, wherein the at least one scaffold layer substantially increases the effective surface area of the substrate, and optionally the at least one scaffold layer is present between the substrate and the perovskite pattern.

In some embodiments, the at least one scaffold layer comprises a metal oxide, wherein the at least one scaffold layer is a porous layer or a layer comprising a fine powder, and optionally the at least one scaffold layer is present between the substrate and the perovskite pattern.

In some embodiments, the at least one scaffold layer comprises a metal oxide, wherein the at least one scaffold layer is nano-structured and/or is nanoporous, and optionally the at least one scaffold layer is present between the substrate and the perovskite pattern.

In some embodiments, the at least one scaffold layer comprises a metal oxide, wherein the at least one scaffold layer comprise powder (particles) in the form of nanoparticles, and optionally the at least one scaffold layer is present between the substrate and the perovskite pattern.

In some embodiments, the at least one scaffold layer comprises a metal oxide, wherein the at least one scaffold layer comprises a powder (particles) in the form of nanoparticles, having a diameter in the range of a few hundred nanometers to a few nanometers, and optionally the at least one scaffold layer is present between the substrate and the perovskite pattern.

In some embodiments, the at least one scaffold layer comprises a metal oxide, wherein the at least one scaffold layer comprise powder (particles) in the form of nanoparticles, having nanoparticles size between 1 nm and 500 nm, and optionally the at least one scaffold layer is present between the substrate and the perovskite pattern.

In some embodiments, the at least one scaffold layer comprises a metal oxide, wherein the at least one scaffold layer comprise powder (particles) in the form of nanoparticles, having nanoparticles size between 1 nm and 300 nm, and optionally the at least one scaffold layer is present between the substrate and the perovskite pattern.

In some embodiments, the at least one scaffold layer comprises a metal oxide, wherein the at least one additional layer comprise powder (particles) in the form of nanoparticles, having nanoparticles size between 3 nm and 300 nm, and optionally the at least one scaffold layer is present between the substrate and the perovskite pattern.

In some embodiments, the at least one scaffold layer comprises a metal oxide, wherein the at least one scaffold layer comprise powder (particles) in the form of nanoparticles, having nanoparticles size between 3 nm and 200 nm, and optionally the at least one scaffold layer is present between the substrate and the perovskite layer.

In some embodiments, the metal oxide is selected from titanium oxide and zirconium oxide. In some embodiments, the metal oxide is titanium oxide ($TiO_2$).

In some embodiments, the scaffold layer is flexible.

In some embodiments, the scaffold layer is transparent.

In some embodiments, the scaffold layer is transparent to all wavelengths used in an end application. In some embodiments, the scaffold layer is transparent to all wavelengths used in a solar cell. In some embodiments, the scaffold layer is transparent to all wavelengths used in a light emitting diode. In some embodiments, the scaffold layer is transparent in the visible spectral regime. In some embodiments, the scaffold layer is transparent in the NIR and/or IR spectral regime. In some embodiments, the scaffold layer is transparent in the visible-IR spectral regime.

In an element of the invention, at least one perovskite pattern is provided below and/or on top of the scaffold layer. In some embodiments, in an element of the invention at least one perovskite pattern is provided on top of the scaffold layer.

The perovskite pattern is as described herein.

In an element of the invention, at least one conductive layer and/or at least one hole conductive layer (hole-transport material) may be provided below and/or on top of the perovskite pattern and/or perovskite layer. In some embodiments, in an element of the invention, at least one hole conductive layer is provided on top of the scaffold layer.

In some embodiments, the at least conductive layer and/or at least one hole conductive layer is in the form of a continuous pattern.

In some embodiments, the conductive pattern and/or at least one hole conductive pattern and the perovskite pattern are stacked on each other. In some embodiment, the layers are all stacked concentrically. Each pattern may follow the contour lines of a previous pattern and may have substantially or about the same dimensions.

The hole transport material may be made of a conductive polymer such as OMETAD Spiro, polyazulenes, polyphenylenes, polypyrenes, polynaphthalenes, polyester (PET), polyimide, poly(pyrrole)s, (PPY), poly(thiophene)s (PT), poly(3,4-ethylenedioxythiophene) (PEDOT), polyazepines, polyindoles, polycarbazoles, poly(p-phenylene vinylene) (PPV), Poly(acetylene)s (PAC), poly(p-phenylene sulfide) (PPS), poly-3-hexyl thiophene (P3HT), and polyanilines.

In some embodiments, the hole conductive layer is flexible.

In some embodiments, the hole conductive layer is conductive.

In some embodiments, the hole conductive layer is transparent.

In some embodiments, the hole conductive layer is transparent to all wavelengths used in the end application. In some embodiments, the hole conductive layer is transparent to all wavelengths used in a solar cell. In some embodiments, hole conductive layer is transparent in the visible spectral regime. In some embodiments, hole conductive layer is transparent in the NIR and/or IR spectral regime. In some embodiments, hole conductive layer is transparent in the visible-IR spectral regime.

In an element of the invention, at least one conductive layer is provided below and/or on top of the perovskite pattern. In some embodiments, in an element of the invention, at least one conductive layer is provided on top of the perovskite pattern. In some embodiments, the conductive layer is or comprises a metal, either pure form or a metal alloy.

In some embodiments, the at least one conductive layer comprises a transition metal selected from Sc, Ti, V, Cr, Mn, Fe, Ni, Cu, Zn, Y, Zr, Nb, Tc, Ru, Mo, Rh, W, Au, Pt, Pd, Ag, Mn, Co, Cd, Hf, Ta, Re, Os, Ir, Hg and any combination thereof.

In further embodiments, the conductive layer comprise a metal, such as gold, silver, copper, platinum, nickel, palladium, titanium, iridium or any combination thereof.

In yet further embodiments, the conductive layer comprise Au and/or Ag.

In some embodiments, the conductive layer is a carbon substrate or HOPG (graphite).

In some embodiments, the conductive layer is an inorganic semiconductor material, including but not limited to, silicon, tin, compounds of boron, tellurium, geranium, gallium, gallium arsenide (GaAs), gallium phosphide (GaP), cadmium telluride (CdTe), gallium aluminum arsenide (GaAlAs), indium phosphide (InP), gallium arsenide phosphide (GaAsP), cadmium sulfide (CdS), copper indium gallium diselenide (CIGS), mercury cadmium telluride (HgCdTe), and copper indium sulfide or selenide.

In some embodiments, the conductive layer is flexible.

In some embodiments, the conductive layer is transparent.

In some embodiments, the conductive layer is transparent to all wavelengths used in an end application. In some embodiments, the conductive layer is transparent to all wavelengths used in a solar cell. In some embodiments, the conductive layer is transparent in the visible spectral regime. In some embodiments, the conductive layer is transparent in the NIR and/or IR spectral regime. In some embodiments, the conductive layer is transparent in the visible-IR spectral regime. In some embodiments, the conductive layer is transparent in the visible spectral regime.

In some embodiments, the conductive layer is a polymer (conductive polymer), such as polyazulenes, polyphenylenes, polypyrenes, polynaphthalenes, polyester (PET), polyimide, poly(pyrrole)s, (PPY), poly(thiophene)s (PT), poly(3,4-ethylenedioxythiophene) (PEDOT), polyazepines, polyindoles, polycarbazoles, poly(p-phenylene vinylene) (PPV), Poly(acetylene)s (PAC), poly(p-phenylene sulfide) (PPS), poly-3-hexyl thiophene (P3HT), and polyanilines.

The intervening layer (herein referred to as the "additional layer") which may not be a scaffold structure layer (e.g., $TiO_2$ layer), and which, in some embodiments, may be positioned between the perovskite layer and the substrate may be one or more additional layer(s) that assist in optimizing the operation or function of the element (solar cell) at the end application (when integrated in a device).

In some embodiments, the additional layer is in the form of a continuous pattern.

In some embodiments, the additional (layer) pattern and the perovskite pattern are stacked on each other. In some embodiment, the layers are stacked concentrically. Each pattern may follow the contour lines of a previous pattern and may have substantially or about the same dimensions.

In some embodiments, at least one additional layer is positioned between the scaffold layer and the substrate. In some embodiments, at least one additional layer is positioned between the perovskite pattern and the scaffold layer. In some embodiments, at least one additional layer is positioned between the perovskite pattern and the at least one conductive layer and/or at least one hole conductive layer. In some embodiments, at least one additional layer is positioned between at least two perovskite patterns. In some embodiments, at least two additional layers are provided on each layer or pattern or substrate.

The number of additional layers in an element of the invention is unlimited. In some embodiments, the number of additional layers is between 1 and 100. In other embodiments, the number of additional layers is between 1 and 50. In further embodiments, the number of additional layers is between 1 and 10. In further embodiments, the number of additional layers is 1 or 2 or 3 or 4 or 5 or 6 or 7 or 8 or 9 or 10.

In some embodiments, the additional layer is a protective layer or blocking layer. The protective layer may be made of a thin inorganic material or another metal oxide layer with a wide band gap for the purpose of blocking the back reaction from the perovskite to the metal contact.

In some embodiments, the protective layer is in the form of a continuous pattern.

In some embodiments, the protective or blocking pattern (layer) and the perovskite pattern are stacked on each other. In some embodiment, the layers are stacked concentrically. Each pattern may follow the contour lines of a previous pattern and may have substantially or about the same dimensions.

In some embodiments, the protective layer is an anti-reflecting layer. In some embodiments, the protective layer is of a dielectric material.

In further embodiments, the protective layer is a metal oxide, such as SiO, $SiO_2$, $Si_3N_4$, $TiO_2$, $Ta_2O_5$, $Al_2O_3$, $ZrO_2$, $Nd_2O_3$, $MgF_2$, MgO, $SrF_2$, ZnO, $MoO_3$, In—ZnO and $Hf_2O$. Where the protective layer is of a scaffold structure material, e.g., $TiO_2$, it is not positioned between the substrate and the perovskite material.

In some embodiments, the protective layer is a moisture barrier to protect moisture induced instability. In other embodiments, the protective layer is a thermal conductor to assist in minimizing hot-spot heat degradation.

In some embodiments, the protective layer comprises fluorinated polymers.

In some embodiments, the protective layer is ITO or FTO.

In some embodiments, the protective layer is titanium diisopropoxide bis(acetylacetonate).

The element may be semi-transparent or transparent and/or conductive.

The thickness of an element of the invention depends on the thickness of each of the layers and substrate. The thickness of the element may be in the millimeter regime or micrometer regime or the nanometer regime. The thickness of the element (with or without the substrate) may be between 1 nm and 100 mm. In some embodiments, the thickness of the element (with or without the substrate) may be between 1 nm and 100 μm. In some embodiments, the thickness of the element (with or without the substrate) may be between 10 nm and 100 μm. In some embodiments, the thickness of the element (with or without the substrate) may be between 10 nm and 10 μm.

In some embodiments, the element (including substrate) of the invention is flexible. In other embodiments, the element of the invention, excluding the substrate, is flexible.

In some embodiments, the element of the invention is in a solid state.

In another aspect, the invention provides a method for forming an element of the invention, the method comprising:
  obtaining a substrate;
  optionally, placing (or applying or depositing or forming) at least one additional layer on the substrate, wherein this step may be repeated after each subsequent step;
  optionally, placing (or applying or depositing or forming) at least one scaffold layer on the substrate or on at least one additional layer;
  forming (or applying or depositing or forming) at least one continuous perovskite pattern on the substrate or on the at least one additional layer;
  optionally placing (or applying or depositing or forming) a hole conductive layer on top of said continuous perovskite pattern or on at least one additional layer; and
  optionally placing (or applying or depositing or forming) a conductive layer on top of said perovskite pattern or on at least one additional layer.

The perovskite pattern may be formed as described herein.

Any of the non-perovskite layers, may be in the form of a (continuous) pattern and may be formed by applying the same steps of forming the perovskite pattern, with the necessary applicable changes.

In some embodiments, the method of the invention comprises one or more steps of pre-treating or post-treating the surface of the substrate or any layer thereon. The pre-treatment or the post-treatment may include, in a non-limiting fashion, solvent or chemical washing (e.g., by a non-liquid medium such as a gas), etching, heating, deposition of an optionally patterned intermediate layer or the patterning device, as well as further surface treatments such as plasma treatment, UV-ozone treatment, or corona discharge.

Each process step may be performed by any protocol and means known in the art. In some embodiments, the means for layer placement is by deposition. In some embodiments, deposition means are selected from dipping, spin coating, roll coating, spraying, dispensing, printing, ink-jet printing, lithography, stamping, drop casting and any combination thereof.

In some embodiments, coating or deposition means comprise placing droplets of a dispersion of nanoparticles at a desired region(s) by printing, jet printing, differential roll printing, contact printing, coating, spin coating, or any combination thereof.

In some embodiments, the process involves material deposition by printing, e.g., ink jetting.

In some embodiment, the scaffold layer is formed by placing (coating, e.g., spin coating) a dispersion of (nano) particles on the substrate. Subsequently, annealing may be carried out. The annealing may involve heating at a temperature between 200 to 600° C. The coating of the nanoparticles may be carried out subsequently to chemical treatment (e.g., with salt solution) and annealing.

In some embodiment, a conductive layer is formed by placing (coating, e.g., spin coating) a conductive material layer by means of material evaporation.

As the method of the invention may use a variety of printing steps, the layers, as well as the stacked layers of the invention may be patterned. In some embodiments, a conductive pattern is formed on top of a perovskite pattern or on at least one additional layer.

The invention also provides a device implementing or comprising at least one continuous perovskite pattern or an element of the invention.

In another aspect, the invention provides a device comprising a perovskite pattern of the invention.

In another aspect, the invention provides a device comprising an active component (e.g., sensitizer or light harvester or light concentrator), the active component consisting a substrate, at least one continuous perovskite pattern, at least one conductive layer, optionally a scaffold structure layer, optionally at least one hole conductive layer, and optionally at least one additional layer.

In another aspect the invention provides a device comprising an active component, the active component comprising a substrate, at least one continuous perovskite pattern, at least one conductive layer, optionally a scaffold structure layer, and optionally at least one additional layer, wherein said element is devoid of (or free of) a hole conductive layer.

In another aspect, the invention provides a device comprising an active component, the active component comprising a substrate, at least one continuous perovskite pattern, at least one conductive layer, optionally at least one hole conductive layer, and optionally at least one additional layer, wherein said element is devoid of (or free of) a scaffold structure layer.

In some embodiments, the device is semi-transparent or transparent.

In another aspect, the invention provides a device comprising an active component, the active component consisting a substrate, at least one continuous perovskite pattern, a conductive layer, optionally a scaffold structure layer, optionally at least one hole conductive layer, and optionally at least one additional layer, wherein the element is semi-transparent or transparent.

In the above embodiments, elements of the invention may be integral parts of a device or may be a substrate which following its treatment as recited is implemented in a device. The device may be an electronic device or an optoelectronic device.

The element may be a heterojunction.

The elements or heterojunction of the invention may be integrated in devices that require transmittance and/or efficient conversion of light including visible, UV, IR, and/or NIR regions of the electromagnetic spectrum. Such devices may be electrical-to-optical and/or optical-to-electrical transducers.

Also, such devices may be, for example, photoconductors and/or photodiodes and/or solar cells and/or luminescent concentrator, light emitting diodes (LEDs) and/or including organic light emitting diodes and lasers; and/or light sensors and/or pixel sensors, and/or specialized transistors and/or including organic transistors and/or inorganic transistors and/or hybrid transistors.

Other applications for utilization of elements of the invention may be related to printed electronics and/or touch screens and/or display backplanes and/or large or small area flexible applications.

The device of the invention may be used for optoelectronic applications and/or RF radio and/or power rectifier and/or light-dependent resistors (LDRs) and/or others.

In some embodiments, the device is a light emitting diode comprising at least one (e.g., organic-inorganic) perovskite pattern of the invention.

In some embodiments, the element or heterojunction of the invention is a photovoltaic cell (a solar cell) device.

Thus, the invention also provides a solar cell comprising at least one (e.g., organic-inorganic) perovskite pattern of the invention.

The solar cell of the invention may further comprise a scaffold layer which increases the surface area between the perovskite pattern and the substrate, and therefore assists in reducing or diminishing recombination processes and therefore increases the device efficiency.

The solar cell of the invention may further comprise a conductive layer which is the counter electrode of the cell and is made of a conductive material such as a metal. The counter electrode may be connected to the conductive support layer (conductive glass or plastic) either directly, or through a current collector which is connected to an external current.

The invention further provides a photovoltaic cell free of hole conductive layer.

The element or heterojunction of the invention may be integrated into electronic devices, specifically, photovoltaic cells by forming the element as described herein on a substrate selected from glass, conductive glass, FTO, ITO, silicon (mono-crystalline or poly-crystalline), conductive polymers, metals, thin films which may consist semiconductor materials that are deposited by means such as CVD (chemical vapor deposition), PVD (pressure vapor deposition) and organic semiconductor substrates.

In some embodiments, the photovoltaic is deposited on a transparent glass substrate. In some embodiments, the photovoltaic is deposited on a conductive glass substrate.

In some embodiments, the elements or heterojunctions of the invention are luminescence solar (light) concentrators and the substrate may be silicon or glass (or any other). In some embodiments, the light concentrator is an element in a photovoltaic cell device.

As the continuous perovskite pattern is easy to control and achieve and therefore may form a large scale pattern, a large scale element and a large scale device, the perovskite pattern of the invention is suitable to (large) panel devices, such as solar panels.

In some embodiments, the elements or heterojunctions of the invention may be integrated as multi-cell arrays on a substrate, to form solar panels.

The inventors of the present invention have further developed a hybrid meso-planar perovskite-based electronic or optoelectronic element or device (e.g., solar cells or light emitting diodes). This hybrid meso-planar perovskite-based electronic or optoelectronic device (i.e., solar cells) is advantageous as it enjoys the benefits of both structures. On one hand, the device contains a grid scaffold layer (e.g., $TiO_2$), which increases the surface area and therefore assists in reducing or diminishing recombination processes providing more efficient device and, on the other hand, the device contains a planar junction, a direct contact of the active layer, the perovskite layer, with the electrode (substrate, blocking layer, additional layer, etc.).

The hybrid meso-planar perovskite-based electronic or optoelectronic elements or devices may be formed by (but not restricted to) a method based on self-assembly of scaffold materials or scaffold precursor's solutions through wetting along the wall of a printing screen (mesh). This method enables defining precisely the desired pattern and therefore endows the ability to control the features of the pattern (e.g., the openings size or the thickness of the scaffold rim or side), and also insures fabrication of continuous patterns having uniform composition throughout the film, and endows the ability to form large scale pattern with excellent reliability and durability features (of the device based thereon).

Thus, the present invention is further aimed at providing novel hybrid meso-planar electronic or optoelectronic elements or devices (e.g., solar cells, light emitting diode), processes for their production and uses thereof in the constructions of photo/electronic devices (e.g., solar cell, light emitting diode).

The hybrid meso-planar perovskite-based devices according to the present invention may comprise thin lines of scaffold material, surrounding two-dimensional confined regions of various shapes, said regions may be empty or filled with the another material. In some embodiments, the other material is a non-perovskite material. In other embodiments, the other material is the material of the active layer, e.g., a perovskite material. The void regions refer to areas not covered by the scaffold material. The voids can have various shapes such as a square, grid, a circle or an irregular shape. These scaffold patterns can be obtained by direct printing of scaffold or scaffold precursor solution to form grids, by self-assembly of scaffold or scaffold precursor solution into a mesh or a grid, or by any other method which results in hybrid meso-planar structures, such as utilizing scaffold nanoparticles or combining volatile emulsions with scaffold material.

In another aspect the invention provides an element comprising at least one continuous pattern of a scaffold material, wherein the pattern is selected to have a plurality of confined regions, being empty or at least partially filled with a perovskite material.

In another aspect the invention provides a continuous pattern of a scaffold material defined by confined regions, which may or may not be filled at least partially with another material (e.g., material of the active layer, e.g., perovskite).

In another aspect, the invention provides a pattern comprising of at least one continuous pattern of a scaffold material, wherein the pattern being defined by a plurality of intersecting wire-like element(s), said element(s) defining confined regions enclosed by walls of said intersecting wire-like elements, wherein said wire-like elements are of at least one scaffold material.

As used herein, the term "pattern" refers to a shape formed of a material, i.e., scaffold, wherein the shape is selected to have at least one material-free void (or confined regions). Typically, a pattern of the invention comprises a plurality (more than one) of confined regions.

The "confined regions" are cells or regions within the pattern material (e.g., scaffold), which may be empty or comprise or are at least partially filled with a different material. The dimensions of the confined regions, as well as the line dimensions are controllable dimensions and the dimensions may be as small or as large as desired.

The confined regions average diameter may be less than 1,000 micrometer. In some embodiments, the confined regions diameter is less than 500 micrometer. In some embodiments, the confined regions diameter is less than 300 micrometer. In some embodiments, the confined regions diameter is less than 100 micrometer. In some embodiments, the confined regions diameter is less than 50 micrometer. In some embodiments, the confined regions diameter is less than 30 micrometer. In some embodiments, the confined regions diameter is less than 20 micrometer. In some embodiments, the confined regions diameter is less than 10 micrometer. In some embodiments, the confined regions diameter is less than 5 micrometer.

In some embodiments, the confined regions dimension (average diameter) is between 1 and 1,000 micrometers. In some embodiments, the confined regions diameter is between 20 and 1,000 micrometers. In some embodiments, the confined regions diameter is between 10 and 300 micrometers. In some embodiments, the confined regions diameter is between 1 and 300 micrometers. In some embodiments, the confined regions diameter is between 5 and 300 micrometers. In some embodiments, the confined regions diameter is between 10 and 300 micrometers. In some embodiments the confined regions diameter is between 50 and 500 micrometers. In some embodiments, the confined regions diameter is between 50 and 300 micrometers.

The average line width (the wall thickness) may be less than 50 micrometers. In some embodiments, the line width is less than 20 micrometers. In some embodiments, the line width is less than 10 micrometers. In other embodiments, the line width is less than 5 micrometers.

The average line width may be between 0.1 and 100 micrometers. In some embodiments, the line width is between 0.5 and 100 micrometers. In some embodiments, the line width is between 0.1 and 50 micrometers. In some embodiments, the line width is between 0.5 and 50 micrometers. In some embodiments, the line width is between 0.5 and 30 micrometers. In other embodiments, the line width is between 5 and 30 micrometers. In some embodiments, the line width is between 1 and 20 micrometers. In some embodiments, the line width is between 5 and 20 micrometers.

The average line height may be less than 100 micrometers. In some embodiments, the line height is less than 50 micrometer. In some embodiments, the line height is less than 20 micrometer. In other embodiments, the line height is less than 10 micrometer. In some embodiments, the line height is less than 5 micrometer. In some embodiments, the line height is less than 1 micrometer.

The average line height may be between 0.1 and 100 micrometers. In some embodiments, the line height is between 0.1 and 50 micrometer. In some embodiments, the line height is between 0.1 and 10 micrometers. In some embodiments, the line height is between 0.1 and 5 micrometers. In some embodiments, the line height is between 0.5 and 100 micrometer. In some embodiments, the line height is between 0.5 and 50 micrometer. In some embodiments, the line height is between 0.5 and 10 micrometer. In some embodiments, the line height is between 0.5 and 5 micrometer.

The confined regions may be of any desired shape. The shape may be triangle, square, pentagon, hexagon, diamond, circle, ellipse, etc. In some embodiments, the shape is a polygon. The polygon may have 3, 4, 5, 6, 7, 8, 9, 10 or more sides.

The shape of the confined regions may be abstract or a defined shape. Each or some of the confined regions in the pattern may substantially be the same or may be selected to be different from other confined regions in the same pattern. The pattern or shape of the confined regions may be random or repetitive.

The pattern of the invention may be a continuous pattern. The pattern may have discrete or discontinued regions; however, at least one pattern must be continuous.

The lines between the confined regions are continuous. Each point in the pattern lines is connected, by some path of the pattern lines, to each of the other points in the pattern.

In some embodiments, the pattern may be a continuous network or grid (mesh).

The pattern may be defined by the extent of coverage of the pattern material of the overall area of the pattern or the area the pattern covers (e.g., substrate or active layer). This parameter determines or influences the transparency of the pattern.

In some embodiments, the pattern material coverage is less than 70%. In some embodiments, the pattern material coverage is less than 60%. In some embodiments, the pattern material coverage is less than 50%. In some embodiments, the pattern material coverage is less than 40%. In some embodiments the pattern material coverage, is less than 30%. In some embodiments, the pattern material coverage is less than 20%.

In some embodiments, the pattern material coverage is between 70% and 10%. In some embodiments, the pattern material coverage is between 60% and 10%. In some embodiments, the pattern material coverage is between 60% and 20%. In some embodiments, the pattern material coverage is between 60% and 30%. In some embodiments, the pattern material coverage is between 50% and 20%. In some embodiments the pattern material coverage is between 50% and 30%.

The pattern may be semi-transparent or transparent.

In some embodiments, the pattern of the invention is conductive.

In some embodiments, the substrate is conductive and transparent.

In some embodiments, the pattern is semi-transparent or transparent to all wavelengths used in the end application. In some embodiments, the pattern is semi-transparent or transparent to all wavelengths used in a solar cell. In some embodiments, the pattern is semi-transparent or transparent in the visible spectral regime. In some embodiments, the pattern is semi-transparent or transparent in the NIR and/or IR spectral regime. In some embodiments, the pattern is semi-transparent or transparent in the visible-IR spectral regime. In some embodiments, the pattern is semi-transparent or transparent in the visible spectral regime.

In some embodiments, the pattern has light transparency (or average light transparency) of at least 20%, at least 30%, at least 40%, at least 50%, at least 60%, at least 70%, at least 80%, at least 85%, at least 90%, at least 95% or at least 97% transparency (e.g., in visible light and/or IR).

In some embodiments, the pattern has light transparency between 15% and 97%. In some embodiments, the pattern has a light transmittance between 15% and 95%. In some embodiments, the pattern has a light transmittance between 15% and 90%. In some embodiments, the pattern has a light transmittance between 15% and 80%. In some embodiments, the pattern has a light transmittance between 20% and 80%. In some embodiments, the pattern has light transparency between 15% and 70%. In some embodiments, the pattern has a light transmittance between 20% and 70%. In some embodiments, the pattern has a light transmittance between 30% and 70%. In some embodiments, the pattern has a light transmittance between 15% and 60%. In some embodiments, the pattern has a light transmittance between 15% and 50%. In some embodiments, the pattern has a light transmittance between 15% and 40%.

The scaffold material may be composed of a metal oxide.

In some embodiments, the at least one scaffold comprises a metal oxide, wherein the at least one scaffold pattern (substantially) increases the effective surface area of the substrate, and optionally the at least one scaffold layer is present between the substrate and the perovskite layer.

In some embodiments, the at least one scaffold layer comprises a metal oxide, wherein the at least one scaffold layer is a porous pattern or a layer (pattern) comprising a fine powder, and optionally the at least one scaffold pattern is present between the substrate and the perovskite layer.

In some embodiments, the at least one scaffold layer comprises a metal oxide, wherein the at least one scaffold pattern is nanostructured and/or is nanoporous, and optionally the at least one scaffold pattern is present between the substrate and the perovskite pattern.

In some embodiments, the at least one scaffold pattern comprises a metal oxide, wherein the at least one scaffold pattern comprise powder (particles) in the form of nanoparticles, and optionally the at least one scaffold pattern is present between the substrate and the perovskite layer.

In some embodiments, the at least one scaffold pattern comprises a metal oxide, wherein the at least one scaffold pattern comprise powder (particles) in the form of nanoparticles, having a diameter in the range of a few hundred nanometers to a few nanometers, and optionally the at least one scaffold pattern is present between the substrate and the perovskite layer.

In some embodiments, the at least one scaffold pattern comprises a metal oxide, wherein the at least one scaffold layer comprise powder (particles) in the form of nanoparticles, having nanoparticles size between 1 nm and 500 nm, and optionally the at least one scaffold layer is present between the substrate and the perovskite layer.

In some embodiments, the at least one scaffold pattern comprises a metal oxide, wherein the at least one scaffold pattern comprise powder (particles) in the form of nanoparticles, having nanoparticles size between 1 nm and 300 nm, and optionally the at least one scaffold pattern is present between the substrate and the perovskite layer.

In some embodiments, the at least one scaffold pattern comprises a metal oxide, wherein the at least one additional layer comprise powder (particles) in the form of nanoparticles, having nanoparticles size between 3 nm and 300 nm, and optionally the at least one scaffold pattern is present between the substrate and the perovskite layer.

In some embodiments, the at least one scaffold pattern comprises a metal oxide, wherein the at least one scaffold layer comprise powder (particles) in the form of nanoparticles, having nanoparticles size between 3 nm and 200 nm, and optionally the at least one scaffold pattern is present between the substrate and the perovskite layer.

The material of the scaffold pattern may be meal oxide. In some embodiments, the metal oxide is selected from titanium oxide and zirconium oxide. In some embodiments, the metal oxide is titanium oxide ($TiO_2$).

In some embodiments, the scaffold pattern is flexible.

In some embodiments, the scaffold pattern is transparent.

In some embodiments, the scaffold pattern is transparent to all wavelengths used in an end application. In some embodiments, the scaffold layer is transparent to all wavelengths used in a solar cell. In some embodiments, the scaffold layer is transparent in the visible spectral regime. In some embodiments, the scaffold layer is transparent in the NIR and/or IR spectral regime. In some embodiments, the scaffold layer is transparent in the visible-IR spectral regime. In some embodiments, the scaffold layer is transparent in the visible spectral regime.

The term "confined regions are at least partially filled with a material" refers to confined regions having in them (in the region substantially free of the pattern material) a material other than the pattern material (e.g., scaffold).

In some embodiments, the confined regions are substantially filled with a material (other material or materials).

In some embodiments, the confined regions are at least partially filled, such that the material other than the pattern material is at least partially in contact with an exposed surface of the substrate.

In some embodiments, the confined region is empty.

The other material may be the active layer material. In some embodiments the active layer material is perovskite material.

In another aspect the invention provides a process for producing a continuous pattern of a scaffold material, the process comprising:
  providing a substrate, the substrate having on at least one region thereof a patterning device defined by a plurality of intersecting wire-like element(s), said element(s) being of another material and defining confined regions enclosed by walls of said intersecting wire-like elements (a mesh);
  placing a solution of a scaffold material or a solution of precursors thereof in at least one confined region on said substrate;
  allowing migration of the scaffold material or precursors thereof to the walls of said confined region to form a pattern having substantially the contour of said confined region; and
  optionally treating (e.g., annealing) said pattern.

In another aspect, the invention provides a process for producing an element of the invention the process comprising:
  providing a substrate, the substrate having on at least one region thereof a patterning device defined by a plurality of intersecting wire-like element(s), said element(s)

being of another material and defining confined regions enclosed by walls of said intersecting wire-like elements (a mesh);

placing a solution of a scaffold material or a solution of precursors thereof in at least one confined region on said substrate;

allowing migration of the scaffold material or precursors thereof to the walls of said confined region to form a pattern having substantially the contour of said confined region;

optionally treating (e.g., annealing) said pattern; and optionally, applying or depositing another material layer (e.g., an active layer material, e.g., perovskite), wherein the another material may or may not fill the confined regions of the formed pattern.

The continuous pattern of the invention may be defined by or follows the counter of the plurality of intersecting wire-like element(s) or lines of the patterning device. The pattern/shape of the resulting scaffold pattern formed by the process of the invention is thus at least similar in pattern/shape to at least part of the pattern/shape of the patterning device.

In other embodiments, the process comprising:
providing a substrate;
placing on a region of said substrate a patterning device (grid, screen, mesh);
placing a dispersion of a scaffold material or a solution of precursors thereof on said substrate;
allowing migration of the scaffold material or precursors thereof to the walls of said confined regions to form a scaffold material or precursors thereof pattern having substantially the contour of said confined regions; and after removal
optionally post treating (e.g., annealing) said pattern of scaffold material or precursors thereof.

In other embodiments, the process comprising:
providing a substrate;
placing on a region of said substrate a patterning device (grid, screen, mesh);
placing a dispersion of a scaffold material or a solution of precursors thereof on said substrate;
allowing migration of the scaffold material or precursors thereof to the walls of said confined regions to form a scaffold material or precursors thereof pattern having substantially the contour of said confined regions; after removal
optionally post treating (e.g., annealing) said pattern of scaffold material or precursors thereof; and
optionally, applying or depositing another material layer (e.g., an active layer material, e.g., perovskite), wherein the another material may or may not fill the confined regions of the formed pattern.

In some embodiments, the patterning device is lifted from the substrate prior to post treatment (e.g. annealing) to permit further migration of the scaffold material or scaffold precursors.

In further embodiments, prior to post-treatment, the process further comprises the step of permitting evaporation of the solution medium in which the scaffold material or the scaffold precursors are contained. In some embodiments, the solution medium is permitted to completely dry.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIGS. 1A-E: (FIG. 1A) The structure of the semi-transparent cell: FTO glass/$TiO_2$ compact layer/mesoporous $TiO_2$/grid of $CH_3NH_3PbI_3$/gold. (FIG. 1B) a grid device having a honeycomb-like structure and (FIG. 1C) 2D honeycomb-like electrode. (FIG. 1D) Optical microscope image of the wide grid: opening of ~200 μm (FIG. 1E) Optical microscope image of the dense grid: opening of ~60 μm.

FIGS. 2A-D: (FIG. 2A) UHR-SEM image of perovskite dense grid (top view), (FIG. 2B) UHS-SEM image of the grid line. It can be seen that the line is made of small needle-like assemblies of $CH_3NH_3PbI_3$ crystals. (FIG. 2C) UHR-SEM of the grid voids. (FIG. 2D) UHR-SEM cross section image of the cell where the grid of $CH_3NH_3PbI_3$ perovskite can be observed. The mesh opening was ~60 μm and the assembly solution concentration is 12.5% wt.

FIGS. 3A-B: The grid dimensions vs. the assembly solution concentration (measured by profiler). (FIG. 3A) The average height and width (μm, Full Width at Half Maximum, FWHM) of the grid lines resulted from use of different concentrations of the assembly solutions (% wt). (FIG. 3B) The average cross section area of a grid line (calculated by multiplying the average width line with the average height of the same grid line) vs. assembly solution concentration.

FIGS. 4A-D: (FIG. 4A) The PCE of the semi-transparent HTM free cells vs. their average transparency calculated in the range of 400-800 nm wavelengths. (FIG. 4B) The average transparency of the perovskite solar cells vs. the concentration (% wt) of the assembly solution of the precursors. (FIG. 4C) Images of the semi-transparent HTM free cells with different average transparencies from left to right, 19%, 28%, 38%, 64% and 67%. (FIG. 4D) The current-voltage curves of the semi-transparent HTM free cells with different average transparencies. The PCEs of the cells are 0.41%, 1.02% and 2.39% for the cells of 39%, 25% and 12% transparency, respectively.

FIG. 6A presents cell with 3 blocking layers and wetting agent. FIG. 6B presents cell with 3 blocking layer without wetting agent. FIG. 6C presents cell with 1 blocking layers and wetting agent.

(FIG. 10A) 240 micron mesh and (FIG. 10B) 85 micron mesh.

DETAILED DESCRIPTION OF EMBODIMENTS

Figure 1A:
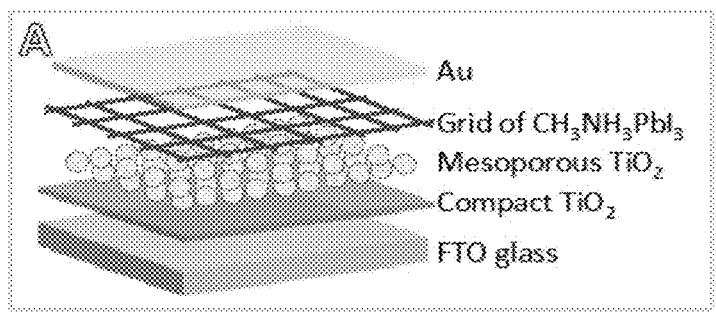

This work reports on semi-transparent hole conductor free perovskite solar cells. The cells transparency is achieved through a unique wet deposition technique that creates perovskite grids with various dimensions. The perovskite grid is deposited on a mesoporous $TiO_2$ layer, followed by evaporation of semi-transparent gold film. No hole conductor is used in this solar cell structure; however a hole conductor may be used in other embodiments of the solar cell. Control of the transparency of the solar cells is achieved by changing the perovskite solution concentration and the mesh openings. The semi-transparent cells demonstrate 20%-70% transparency. This is the first demonstration of the possibility to create a perovskite pattern using self-assembly deposition method for fabrication of a semitransparent perovskite based solar cell.

Here we report on a unique, simple wet deposition method for the fabrication of semi-transparent perovskite-based solar cells. This deposition method is fundamentally different from previously reported deposition methods of $CH_3NH_3PbI_3$ perovskite. The film formation in this method is enabled by the self-assembly of the perovskite solution through wetting along the wall of a conventional printing screen. Semi-transparent perovskite solar cells were fabricated; the perovskite grid was deposited on a mesoporous $TiO_2$ layer, followed by evaporation of semi transparent gold film. Control of transparency is achieved by changing solution concentrations and mesh openings of the printing screen. Using this method, semi-transparent cells with 20%-70% transparency were achieved. Ultra-high resolution scanning electron microscopy (UHR-SEM), an optical microscope and a profilometer were used to characterize the perovskite grids.

Experimental

Methods and Device Fabrication
Precursor Synthesis:

Methyl ammonium iodide (MAI) was synthesized by reacting 27.8 mL of methylamine (40% in methanol, TCI) with 30 mL of hydroiodic acid (57 wt % in water, Aldrich) in a 250 mL round bottom flask at 0° C. for 2 hr while stirring. The precipitate was recovered by removal of the solvent by a rotary evaporator at 50° C. for 1 hr. The white product was washed with ethanol by stirring the mixture for 30 minutes. Then the mixture was filtered and washed with diethylether. The washing step was repeated three times. After filtration, the solid was collected and dried at 60° C. in a vacuum oven for 24 hr.

Device Fabrication:

The substrate of the device was a $SNO_2$:F(FTO) conducting glass (15 $\Omega \cdot cm^{-1}$, Pilkington). A blocking layer was deposited on the FTO glass using a solution of titanium diisopropoxidebis(acetylacetonate) (TiDIP, 75% in isopropanol, Aldrich) in ethanol. The TiDIP solution was spin coated and then annealed at 450° C. for 30 min. The $TiO_2$ nano-particles dispersion was spin coated and annealed at 500° C. for 30 min subsequent to $TiCl_4$ treatment for 30 min at 70° C. and annealing at 500° C. for 30 min. For the perovskite layer, $PbI_2$ and MAI were dissolved in DMF in the following concentrations: 7.5% wt, 10% wt, 12.5% wt, 15% wt and 20% wt. The fabrication of the semi-transparent perovskite grid was conducted directly on the $TiO_2$ layer. The process of fabrication of a transparent grid was reported in the context of preparing transparent conductive coatings. In general, a screen printing stainless steel mesh was placed onto the mesoporous $TiO_2$ layer, followed by placing 10 microliter droplet of the perovskite precursor solution ($PbI_2$ and MAI in DMF with 0.5% wt of Byk 333 wetting agent (Byk, Germany)) on the mesh. On contact, the liquid immediately wets the mesh walls, and the perovskite precursor solution self assembles along the walls of the mesh. After 20 minutes, the mesh was removed, leaving a grid pattern on the $TiO_2$ layer. Two types of meshes were used (FIGS. 1B and 1C): stainless steel and polyester mesh (Ponger, Israel) which were treated by plasma prior to their use (in 20% oxygen for 2 minutes, PICO system, Deiner Electronics). The diameter of the two types of mesh wires was i) 16 micrometers with 60 micrometers spacing between the wires, and ii) 25 micrometers with 298 micrometers spacing between the wires. Following the self-assembly step, the samples were annealed at 90° C. for 30 minutes. During annealing, a grid composed $MAPbI_3$ was formed, as indicated by the dark brown color of the electrodes. Optionally hole transport layer (e.g. Spiro-OMETAD) was deposited on top of the grid. Finally, the back contact was deposited by evaporating 40 nm of gold under pressure of $5*10^{-6}$ Torr. The active area was 0.09 $cm^2$.

Photovoltaic Characterization:

Photovoltaic measurements were made on a New Port system, composed of an Oriel I-V test station using an Oriel Sol3A simulator. The solar simulator was class AAA for spectral performance, uniformity of irradiance, and temporal stability. The solar simulator was equipped with a 450 W xenon lamp. The output power was adjusted to match AM1.5 global sunlight (100 $mWcm^{-2}$). The spectral match classifications were IEC60904-9 2007, JIC C 8912, and ASTM E927-05. I-V curves were obtained by applying an external bias to the cell and measuring the generated photocurrent with a Keithley model 2400 digital source meter. The voltage step and delay time of the photocurrent were 10 mV and 40 ms, respectively.

Transmittance Measurements:

UV-vis transmittance spectra were performed using a Jasco V-670 spectrophotometer. The average transparency was calculated between 400-800 nm wavelengths.

Morphology Evaluation: the grids were observed by optical microscope (MRC Israel), and by a Veeco Dektak 150 profilometer.

Ultra-high resolution scanning electron microscopy (UHR-SEM) was performed by Sirion UHR SEM (FEI, Field Emission Instruments), The Netherlands. The measurement conditions were 5 kV at various magnifications.

Results and Discussion

Perovskite Grid

The present application disclosed a novel process for the preparation of at least semi-transparent, hole-conductor or hole-conductor-free perovskite based solar cells. All layers of the cell were deposited in an ambient environment using simple, low cost self-assembly or spin coating deposition methods (followed by different annealing processes). The transparency measurements and photovoltaic characterizations showed strong correlation between the photovoltaic activity of the cell and its average transparency between 400-800 nm wavelengths. When changing the parameters of the perovskite deposition (mesh opening and solution concentration), the transparency was changed and the photovoltaic activity of the cells varied accordingly.

As noted herein, the perovskite functions both as a light harvester and as a hole conductor. In some embodiments, avoiding the use of a hole conductor has an advantage for the transparency, since hole transport materials (for example, spiro-OMeTAD) absorb in the visible range, thus decreasing the transparency.

The structure of the hole-conductor-free perovskite-based solar cell (FIG. 1A) is as follows: FTO glass/$TiO_2$ compact layer/mesoporous$TiO_2$/grid of Perovskite/thin film of gold.

Interestingly, despite the direct contact between the metal (gold) and the $TiO_2$ film (due to the controlled voids in the perovskite film, which enabled the transparency of the solar cell), the semi-transparent devices showed a photovoltaic performance as discussed below. The perovskite grid was obtained through wetting of the perovskite precursor solution along the walls of a screen mesh which was placed on the mesoporous $TiO_2$ layer. As shown below, the transparency of the cell could be simply controlled by two parameters, (i) mesh opening, and (ii) the precursor solution concentration.

Figure 1B:
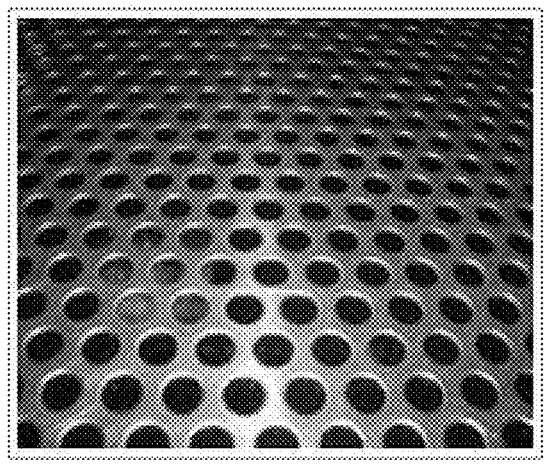
Figure 1C:
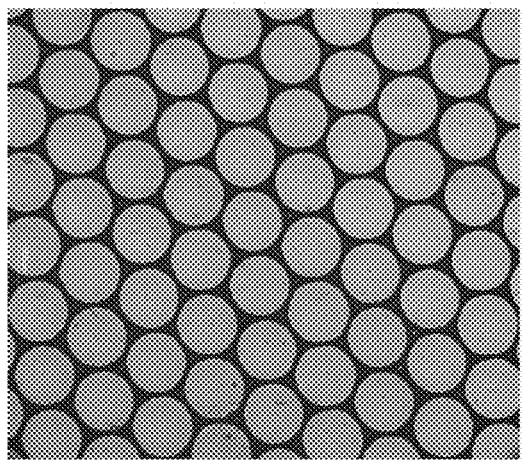

FIGS. 1B and 1C exhibit a grid device having honeycomb-like structure and a 2D electrode in the form of honeycomb-like structure.

Following the deposition of the compact and mesoporous $TiO_2$ layers, a solution of $PbI_2$ and MAI in DMF was placed on top of the screen printing mesh. Due to the presence of the wetting agent, the solution immediately wet the surface and filled the gap between the screen printing mesh and the mesoporous $TiO_2$ layer. During solvent evaporation, the $PbI_2$ and MAI molecules aligned along the mesh wires due to capillary forces. The screen printing mesh was removed after evaporation of the DMF was completed, and a grid pattern was obtained, in which the walls contained crystalline perovskite formed in situ from $PbI_2$ and MAI. An additional annealing step was necessary to complete the crystallization.

Figure 2C:
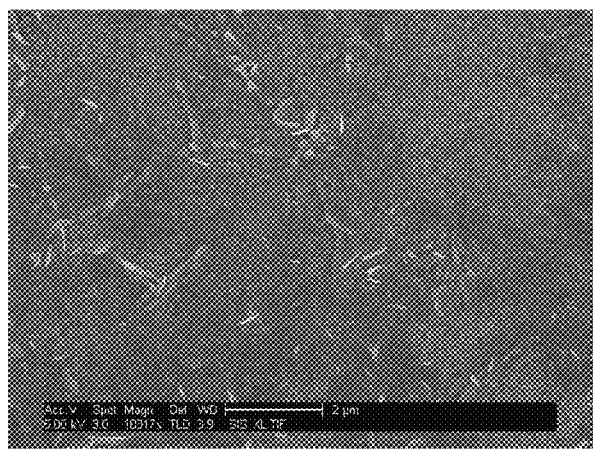

FIGS. 1C-D present optical-microscope images of two different $CH_3NH_3PbI_3$ perovskite grids fabricated on top the mesoporous $TiO_2$ surface, by using meshes with different openings: wide opening (FIG. 1C, square grid opening of ~200 μm), and narrow opening (FIG. 1D, grid opening of ~60 μm). In general, it was found that the grid opening size could be easily controlled by the mesh opening size, thus enabling control of the transparency of the perovskite film (which is actually empty cells surrounded by perovskite crystals). The power conversion efficiency (PCE) is affected by the grid opening, i.e. when the grid opening is large, the PCE is decreased since the active area is smaller and there are more contact points between the metal contact and the mesoporous $TiO_2$. Moreover, no perovskite crystals were present at the open areas in the perovskite grid as shown in FIGS. 1B, 1C and 2A; see also FIG. 2C showing that the growth of perovskite crystals was almost fully eliminated inside the grid squares. The absence of perovskite crystals in the voids supported the efficient control over the final assembly of the perovskite attained by using this deposition method.

FIG. 2A depicts UHR-SEM image of the perovskite grid on top of the mesoporous $TiO_2$ layer. It could be seen that the perovskite crystals formed a super-structure of thin needle-like assemblies (see FIG. 2B), which were present only where the original mesh lines were located.

Figure 2D:
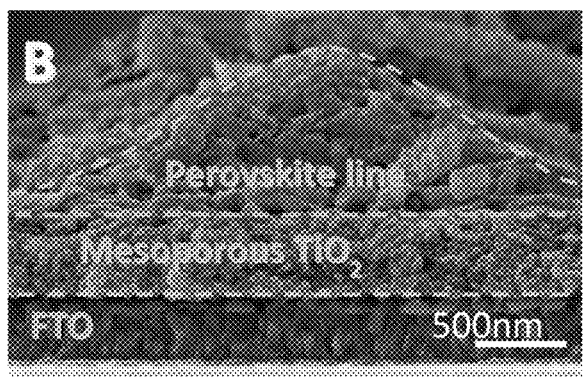

FIG. 2D presents a cross section UHR-SEM image of the semi-transparent solar cell. The perovskite line of the grid can be observed on top of the mesoporous $TiO_2$ layer (the grid boundaries are marked in the figure). The height and the width of the perovskite grid can be controlled by changing the concentration of the $PbI_2$ and MAI concentration in the precursor solution, as shown in FIG. 3 for mesh with openings of ~60 μm.

As seen in FIG. 3A, the average height (relative to the $TiO_2$ layer) of the grid line increased while increasing the solution concentration. However, the width has the same values when using concentrations between 7.5-15% wt, and starts to increase only above this concentration. There is a minimal line width which is a result of the capillary forces between the perovskite molecules and the mesoporous $TiO_2$ layer, meaning even at low concentration, this width was expected to be covered by molecules. FIG. 3B shows the average area of the grid line cross section, (calculated by multiplying the average width of a specific grid line with the average height of the same grid line). As expected, the area of the grid line cross section increased while increasing the concentration of the components of the perovskite precursor solution.

TABLE 1

Photovoltaic parameters, % average transparency between 400-800 nm wavelength and % coverage of the various semi transparent cells.

| Assembly solution concentration (%) | Transparency (%) | Voc (V) | Jsc (mA/cm$^2$) | FF (%) | Efficiency (%) | Coverage (%) |
|---|---|---|---|---|---|---|
| 7.5 | 67 | 0.20 | 0.10 | 31 | 0.01 | 35 |
| 10 | 46 | 0.23 | 1.25 | 31 | 0.09 | 37 |
| 12.5 | 38 | 0.54 | 4.17 | 39 | 0.89 | 38 |
| 15 | 25 | 0.62 | 8.94 | 45 | 2.51 | 31 |
| 20 | 19 | 0.63 | 9.02 | 41 | 2.35 | 53 |

The photovoltaic performance of various assembly solution concentrations using dense grids with opening of ~60 μm are presented in Table 1. As expected, the PCE of the cells decreased when increasing the transparency (FIG. 4A), which is controlled by the precursor solution concentration (FIG. 4B). As a result, the grid lines of the low concentration solution have lower width and height (FIG. 3A) than the grid lines formed from the concentrated solution.

FIG. 4C shows the images of the cells with different transparencies (which were controlled by changing the assembly concentration solution from 7.5% wt to 20% wt, from right to left). The current-voltage curves of the semi-transparent HTM free perovskite solar cells are presented in FIG. 4D for different cell transparencies.

The transparency control by the perovskite grid formation has an important advantage, which is the possibility to calculate the exact coverage of the perovskite grid in the active area. Using this unique self-assembly-based deposition method, it is possible to accurately design the required coverage and transparency of the solar cell. The coverage of the cell is the fraction of area that is covered by the perovskite grid lines, without the grid voids (in which there is no perovskite). It was observed that the coverage of the perovskite solar cells prepared using assembly solution concentrations of 7.5% wt, 10% wt, 12.5% wt and 15% wt are similar (~35±3% of the area is covered by the perovskite grid lines), while only the coverage of the perovskite solar cells that were prepared using assembly solution concentration of 20% wt the coverage was different (~50%). The increase in the coverage for the 20% wt solution concentration can be expected already from the profile measurements (FIG. 3A) in which the width of the grid lines was about the same average values in the case of the lower concentrations (till 15% wt). However, despite the fact that the coverage of the cells in the case of the lower assembly solution concentrations was similar, the cells PV performance was different, as shown in Table 1.

The reason for the difference in PV performance might be due to the fact that the coverage calculations do not take into account the thickness of the perovskite lines, which affects the PV performance.

An interesting outcome is related to the unique structure of the semi-transparent HTM free perovskite solar cells presented in this work. In this solar cell structure, there is a direct contact between the TiO$_2$ layer and the gold layer, which posses large recombination centers, even though a reasonable PV performance was achieved. For example, in the case of 20% coverage, Jsc of 9 mA/cm$^2$ with Voc of 0.63V were achieved. This further supports our previous reports on the possibility to avoid the need for HTM in the perovskite solar cells and demonstrates the superior properties of the perovskite.

TiO$_2$ Grid Based Meso/Planar Hybrid Perovskite Solar Cells

Figure 5:
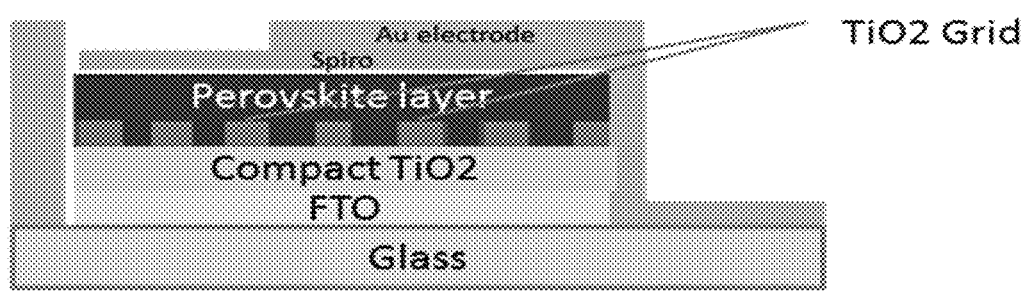
FIG. 5: The structure of $TiO_2$ grid cell.

The application of TiO$_2$ grid has been tested. Cells were fabricated as a hybrid between planar/meso architecture, with thicker and thinner perovskite film alternatively. Cell architecture is presented at FIG. 5.

Figure 6A:
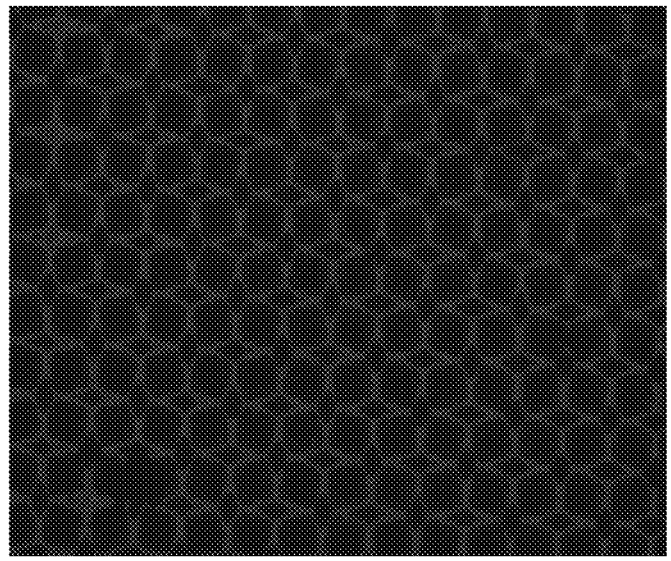
FIGS. 6A-C: Optical microscopic images of $TiO_2$ grid cells.
Figure 6B:
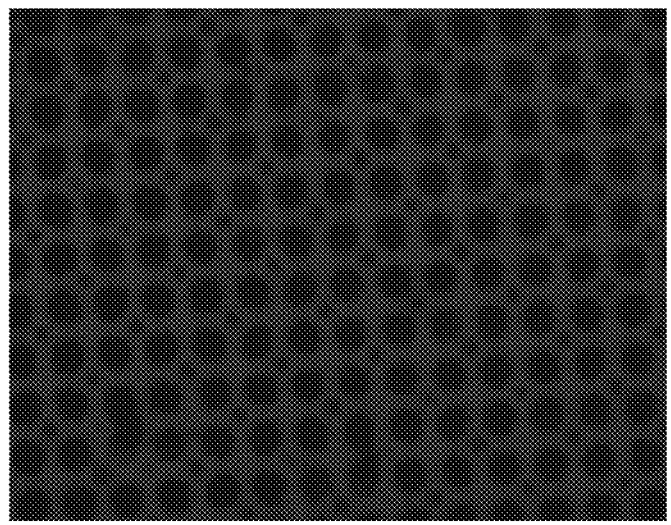
Figure 6C:
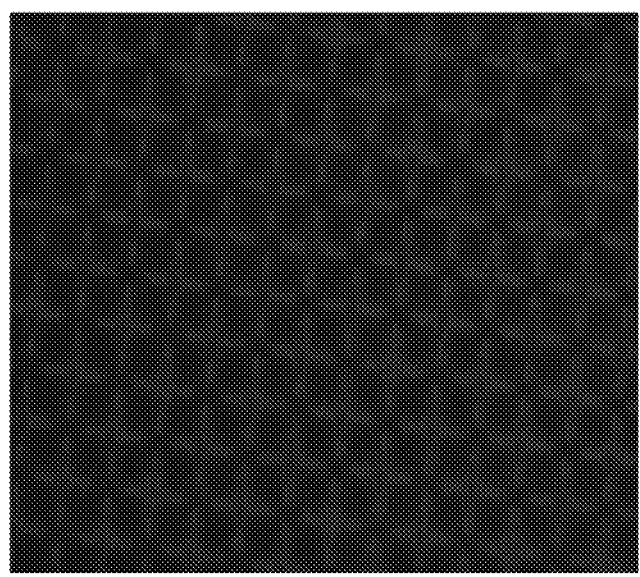
Figure 7A:
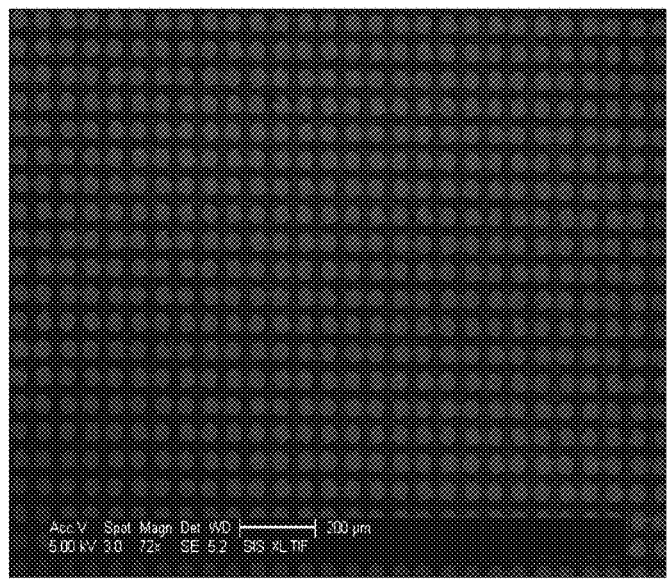
FIGS. 7A-B: presents the SEM images of the $TiO_2$ grid without wetting agent.
Figure 7B:
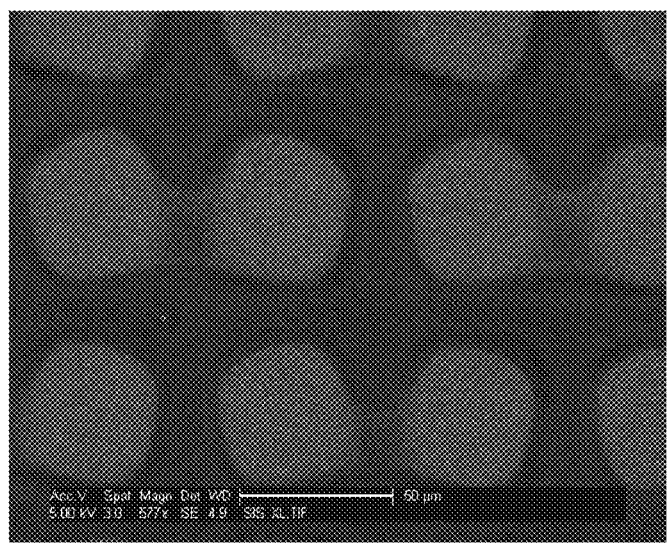

Different steps involved in fabrication of such a cell:
i. Etching and cleaning of FTO substrate
ii. Deposition of Blocking layer (BL) of compact-TiO$_2$
iii. Deposition of meso-TiO$_2$ grids through self-assembly with the help of a metallic mesh of 50 micron mesh size
iv. The metallic mesh was cleaned and placed over the substrates
v. A small quantity of TiO$_2$ solution (7-10 micro liter) has been dropped with the help of a pipette
vi. The substrates were allowed to dry and self assembling of TiO$_2$ grid for 30 minutes
vii. The mesh has been removed gently followed by sintering of TiO$_2$ grid at 500° C.
viii. TiCl$_4$ treatment and further annealing
ix. Deposition of methylammonium lead iodide (MAPbI$_3$) perovskite, through two step deposition method
x. Toluene treatment [4], before annealing
xi. Deposition of Spiro-OMeTAD layer as hole transporting layer
xii. Deposition of Au back contact followed by appropriate oxidation and encapsulation of device Optical microscopic images of TiO$_2$ grid cells are presented in FIG. 6A-C. The cells were found very good in terms of performance. FIG. 6A presents cell with 3 blocking layers and wetting agent. FIG. 6B presents cell with 3 blocking layer without wetting agent. FIG. 6C presents cell with 3 blocking layers and wetting agent. FIG. 7 A-B presents the SEM images of the TiO$_2$ grid without wetting agent.

Figure 8:
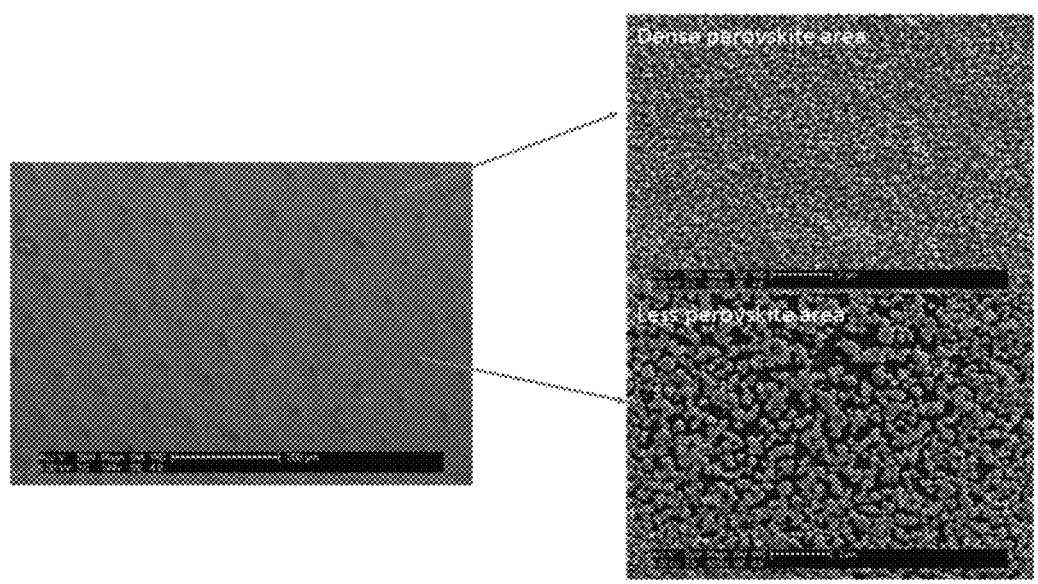
FIG. 8: presents SEM images of perovskite Cells on $TiO_2$ Grid. On the left hand side: presents grid pattern from top view. On the right hand side: presents two different spots at larger magnification.

Perovskite Cells on TiO$_2$ Grid are presented by SEM images FIG. 8. The grid pattern can be seen from top view on FIG. 8, left hand side, and two different spots at larger magnification are presented on FIG. 8, right hand side.

Figure 9A:
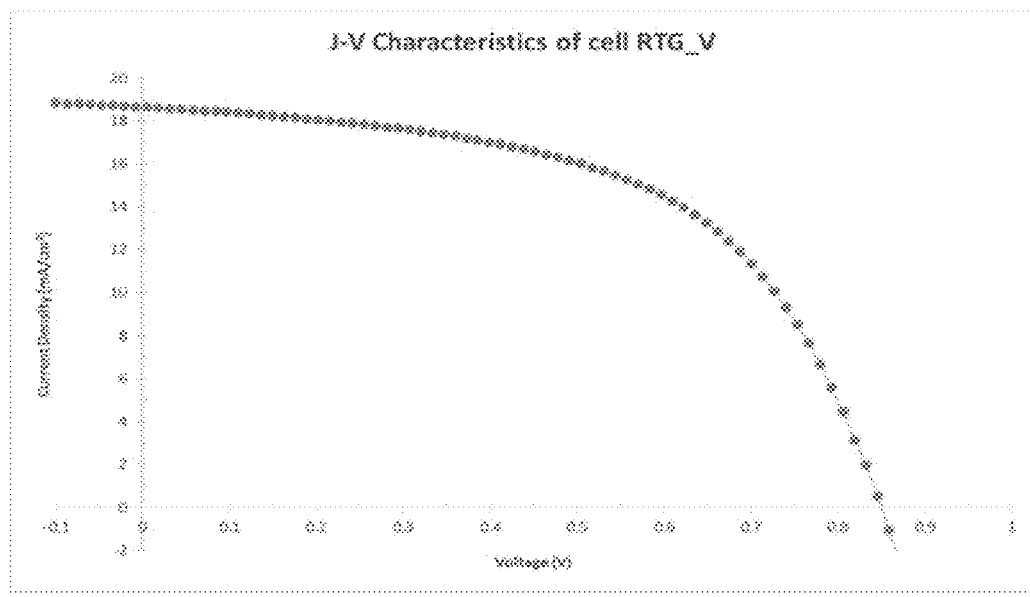
FIGS. 9A-C: presents measurements of current density vs. voltage were conducted.
Figure 9B:
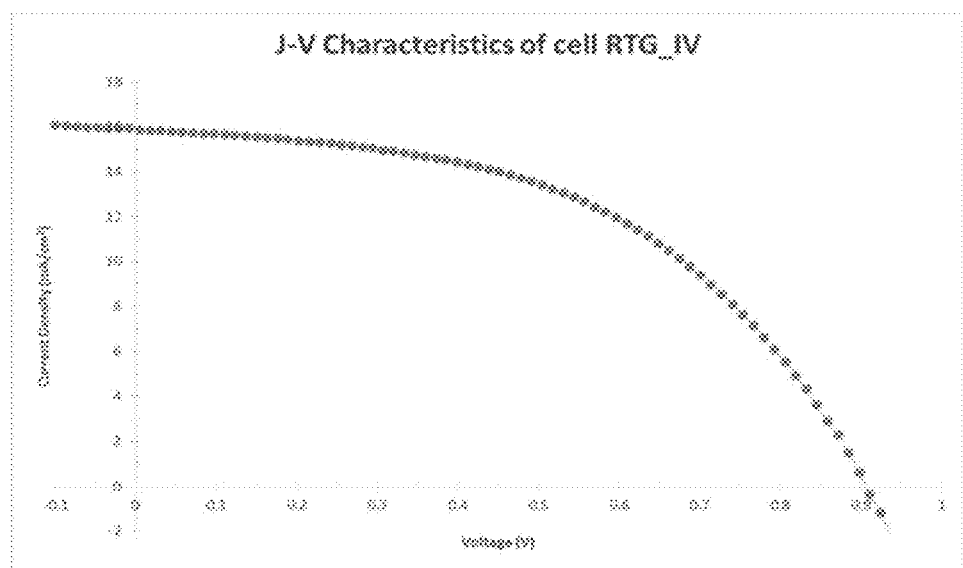
Figure 9C:
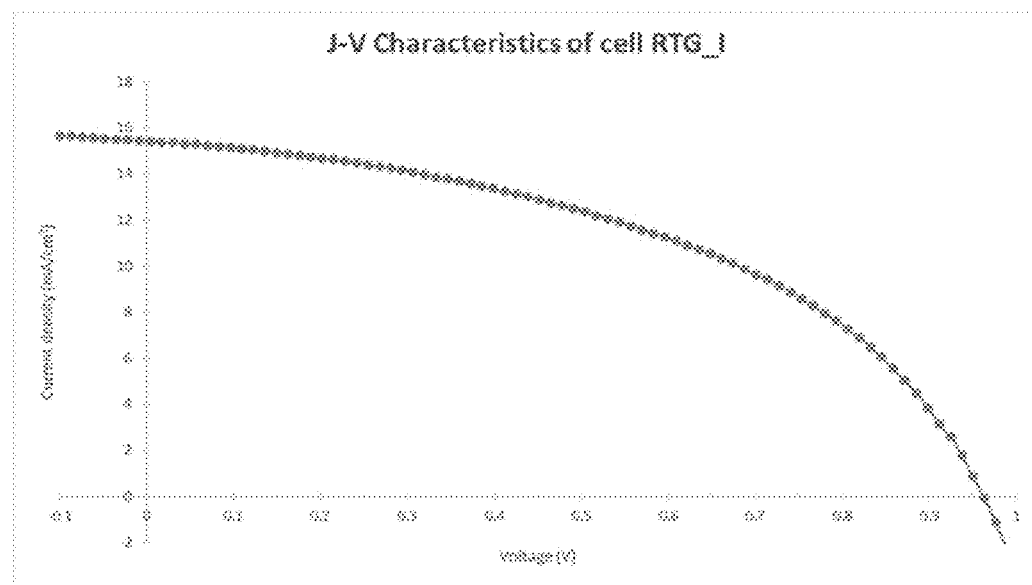

Measurements of current density vs. voltage were conducted (FIGS. 9A-C). The results of the performance of the TiO$_2$ grid cell are summarized in Table 2.

TABLE 2

Results of the performance of the TiO$_2$ grid.

| Cell no. | Voc (V) | Jsc (mA/cm$^2$) | Fill Factor | Efficiency |
|---|---|---|---|---|
| RTG_V | 0.8492 | 18.6378892 | 54.9904 | 8.7031 |
| RTG_IV | 0.9053 | 15.8838335 | 49.579 | 7.1296 |
| RTG_I | 0.9609 | 15.3949365 | 46.1681 | 6.8298 |

Semitransparent Solar Cells with Perovskite Grid

Further experiments to improve the cells transparency and/or performance using polymer mesh are presented here.

The deposition process perovskite using the polymeric mesh is the same as used for titania The solution used here is a one step perovskite deposition sample with different concentration and added wetting agent.

Figure 10A:
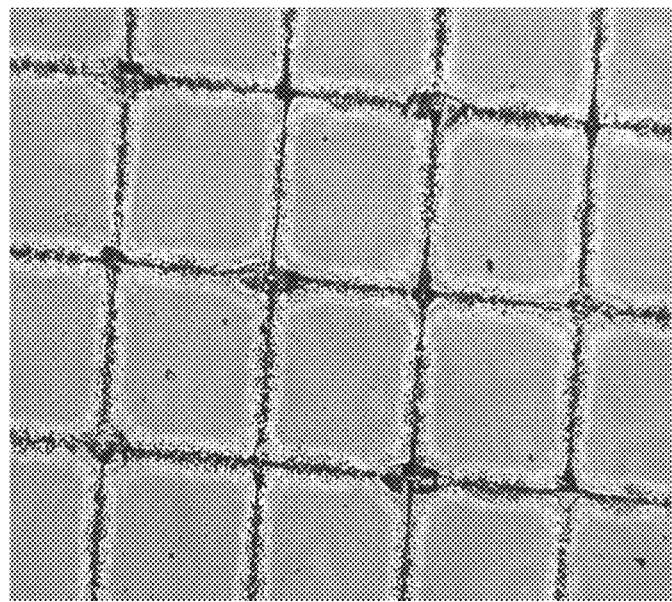
FIGS. 10A-B optical Microscopic images of Perovskite grids with 10%, by weight, perovskite concentration and wetting agent.
Figure 10B:
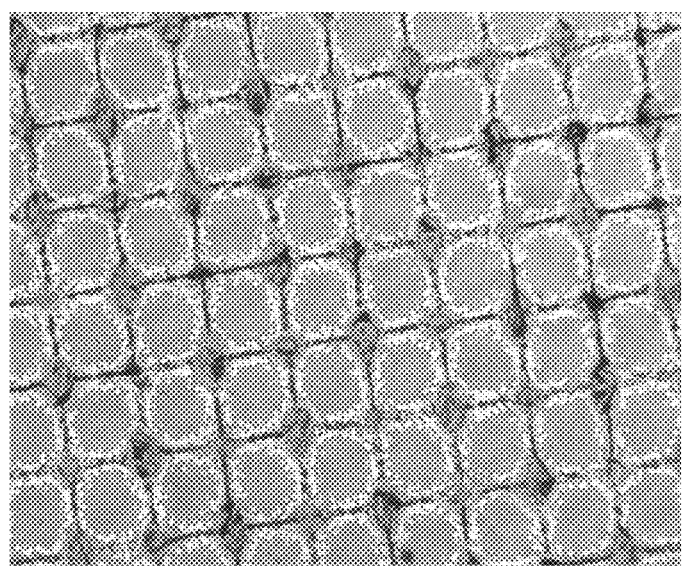
Figure 11A:
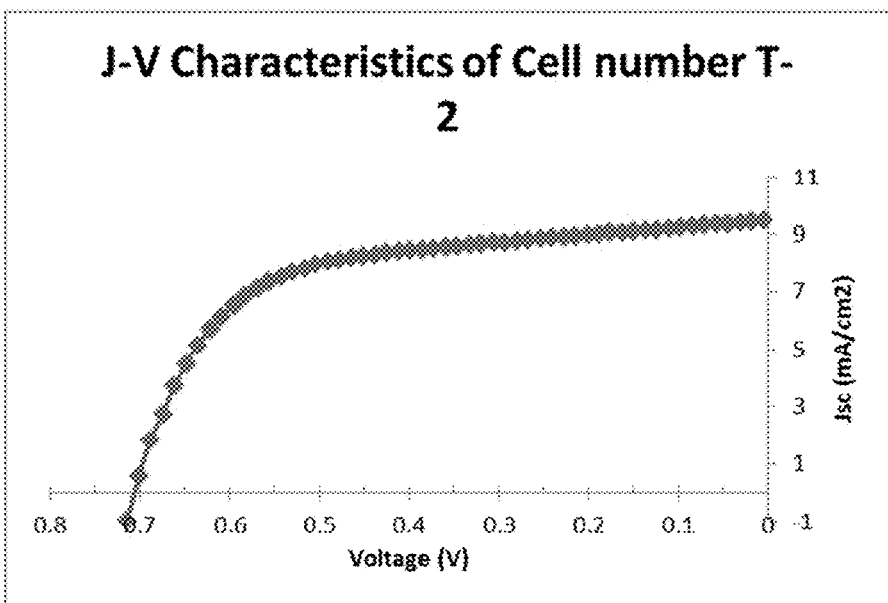
FIGS. 11A-B Measurements of current density vs. voltage were conducted, wherein the perovskite concentration is 7.5% by weight and the wetting agent is 0.5% by weight.
Figure 11B:
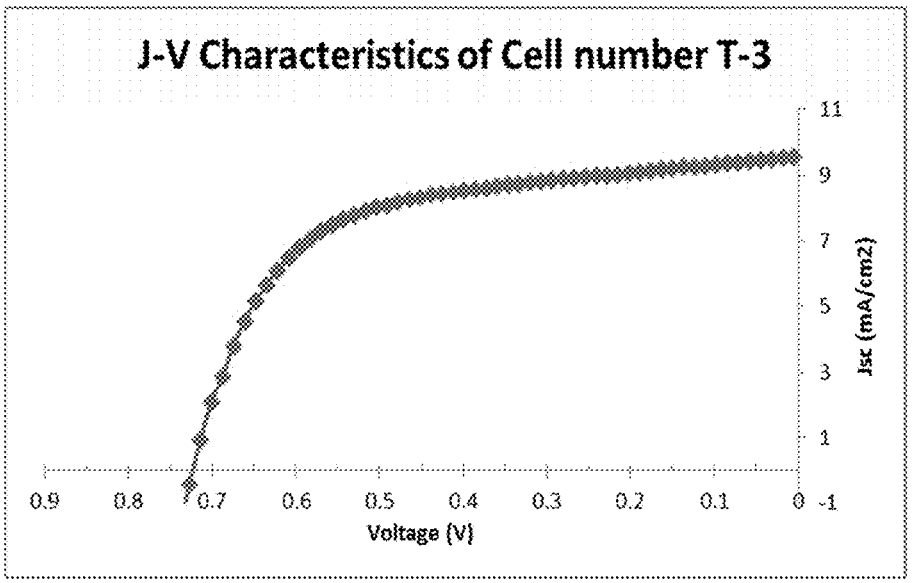
Figure 12A:
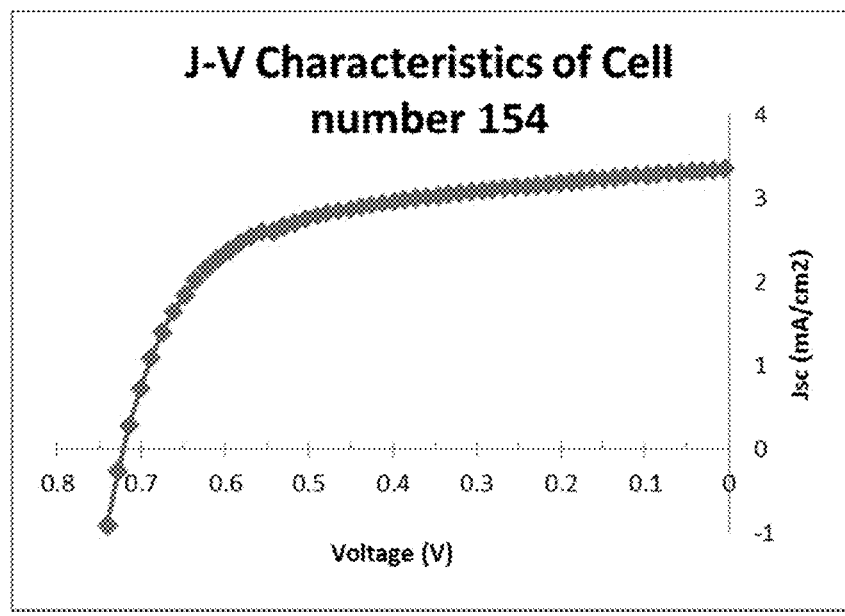
FIGS. 12A-B Measurements of current density vs. voltage were conducted, wherein the perovskite concentration is 12.5% by weight and the wetting agent is 1% by weight.
Figure 12B:
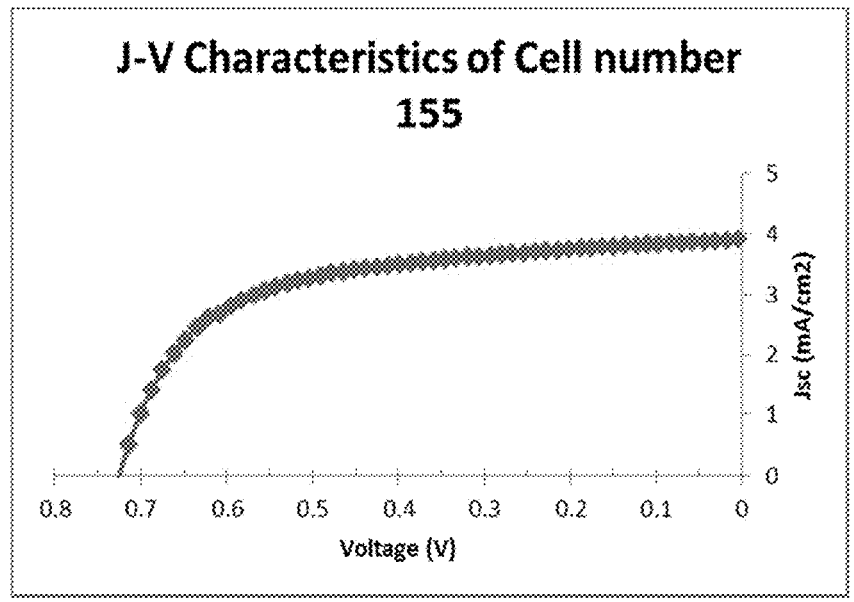

Optical Microscopic images of Perovskite grids with 10% perovskite concentration and wetting agent are presented on FIGS. 10A-B.

Measurements of current density vs. voltage were conducted (FIG. 11A-D). The results of performance of representative perovskite Grid cells in terms of PCE and in terms of Average Transmittance, AVT are summarized in Tables 3 and 4, respectively.

TABLE 3 performance of representative perovskite Grid cells wherein the perovskite concentration is 7.5% by weight and the wetting agent is 0.5%

| Cell no. | Voc (V) | Jsc (mA/cm2) | Fill Factor | Efficiency | Perovskite concentration (%) | Wetting agent (%) | Mesh size (μm) | AVT (%) |
|---|---|---|---|---|---|---|---|---|
| T-2 | 0.705 | 9.52231 | 60.964 | 4.0947 | 7.5 | 0.5 | 85 | 19.1 |
| T-3 | 0.723 | 9.58742 | 60.86 | 4.1643 | 7.5 | 0.5 | 85 | 19.1 |

TABLE 4 performance of representative perovskite Grid cells wherein the perovskite concentration is 12.5% by weight and the wetting agent is 1%

| Cell no. | Voc (V) | Jsc (mA/cm$^2$) | Fill Factor | Efficiency | Perovskite concentration (%) | Wetting agent (%) | Mesh size (μm) | AVT (%) |
|---|---|---|---|---|---|---|---|---|
| 154 | 0.721 | 3.35199 | 59.635 | 1.4413 | 12.5 | 1 | 85 | 41.33 |
| 155 | 0.725 | 3.91554 | 59.93 | 1.7015 | 12.5 | 1 | 85 | 41.33 |

The invention claimed is:

1. A patterned perovskite material, comprising a plurality of continuous intersecting perovskite line patterns, defining confined regions enclosed by walls of said intersecting line patterns, wherein the confined regions are perovskite-free voids.

2. The patterned material according to claim 1, the pattern comprising of a continuous perovskite pattern, the pattern being defined by a plurality of intersecting wire-like element(s), said element(s) defining confined regions enclosed by walls of said intersecting wire-like elements, wherein said wire-like elements are of at least one perovskite material.

3. The patterned material according to claim 1, wherein the pattern is a continuous network or grid (mesh).

4. The patterned material according to claim 3, wherein material coverage is less than 70% or wherein the pattern is semi-transparent or transparent or wherein the pattern is conductive.

5. The patterned material according to claim 1, wherein the perovskite material is characterized by the structural motif $AMX_3$, having a three-dimensional network of corner-sharing $MX_6$ octahedra, wherein M is a metal cation that may adopt an octahedral coordination of the X anions, and wherein A is a cation situated in 12-fold coordinated holes between the $MX_6$ octahedra.

6. The patterned material according to claim 5, wherein the perovskite material is of the formula $AMX_3$ or $AMX_4$ or $A_2MX_4$ or $A_3MX_5$ or $A_2A'MX_5$ or $AMX_{3-n}X'_n$, wherein
A and A' are independently selected from organic cations, metal cations and any combination of such cations;
M is a metal cation or any combination of metal cations;
X and X' are independently selected from anions and any combination of anions; and
n is between 0 to 3.

7. The patterned material according to claim 1, wherein the perovskite material is an organic-inorganic perovskite structure.

8. The patterned material according to claim 7, wherein the organic-inorganic perovskite structure is selected from the group consisting of $(R-NH_3)_2MX_4$ and $(NH-R-NH)MX$; wherein X may be $Cl^{-1}$, $Br^{-1}$, or $I^{-1}$.

9. The patterned material according to claim 8, wherein the perovskite material comprises or is selected from $CH_3NH_3PbF_3$, $CH_3NH_3PbCl_3$, $CH_3NH_3PbI_3$, $CH_3NH_3PbBr_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$ and $CH_3NH_3PbI_2Cl$.

10. The patterned material according to claim 9, wherein the perovskite material comprises or is selected from the group consisting of $CH_3NH_3SnICl_2$, $CH_3NH_3SnBrI_2$, $CH_3NH_3SnBrCl_2$, $CH_3NH_3SnF_2Br$, $CH_3NH_3SnIBr_2$, $CH_3NH_3SnF_2I$, $CH_3NH_3SnClBr_2$, $CH_3NH_3SnI_2Cl$ and $CH_3NH_3SnF_2Cl$.

11. The patterned material according to claim 9, wherein the perovskite material comprises or is selected from the group consisting of $CH_3NH_3PbF_3$, $CH_3NH_3PbCl_3$, $CH_3NH_3PbI_3$ and $CH_3NH_3PbBr_3$.

12. The patterned material according to claim 11, wherein the perovskite material is $CH_3NH_3PbI_3$.

13. The patterned material according to claim 1, wherein the perovskite material is of the formula $(NH_2=CH-NH_2)MX_3$.

14. The patterned material according to claim 13, wherein the perovskite material comprises or is selected from the group consisting of $(NH_2=CH-NH_2)PbBr_3$, $(NH_2=CH-NH_2)PbI_3$, $(NH_2=CH-NH_2)PbCl_3$, $(NH_2=CH-NH_2)PbFCl_2$, $(NH_2=CH-NH_2)PbBrCl_2$, $(NH_2=CH-NH_2)PbICl_2$, $(NH_2=CH-NH_2)PbFCl_2$, $(NH_2=CH-NH_2)PbFBr_2$, $(NH_2=CH-NH_2)PbFI_2$ and $(NH_2=CH-NH_2)PbIBr_2$.

15. A process for producing a continuous perovskite pattern, the process comprising:
providing a substrate, the substrate having on at least one region thereof a patterning device defined by a plurality of intersecting wire-like element(s), said element(s) defining confined regions (material-free voids) enclosed by walls of said intersecting wire-like elements (a mesh);
placing a solution of a perovskite material or a solution of perovskite precursors in at least one confined region on said substrate;
allowing migration of the perovskite material or perovskite precursors to the walls of said confined region (voids) to form a pattern having substantially the contour of said confined region; and
optionally annealing said pattern.

16. An element comprising a substrate, at least one continuous perovskite pattern according to claim 1, at least one conductive layer, and optionally at least one additional layer selected from a scaffold structure layer, at least one hole conductive layer, and at least one additional layer.

17. An element comprising a substrate, a scaffold structure layer, at least one continuous perovskite pattern according to claim 1, at least one conductive layer, and optionally at least one additional layer, wherein said element is devoid of a hole conductive layer.

18. An element comprising a substrate, a scaffold structure layer, at least one continuous perovskite pattern according to claim 1, a conductive layer, optionally at least one hole conductive layer, and optionally at least one additional layer, wherein the element is semi-transparent or transparent.

19. A device comprising a perovskite pattern according to claim 1.

* * * * *